United States Patent
Hirai et al.

(10) Patent No.: US 9,735,815 B1
(45) Date of Patent: Aug. 15, 2017

(54) RADIO APPARATUS

(71) Applicant: FUJITSU LIMITED, Kawasaki-shi, Kanagawa (JP)

(72) Inventors: Kouji Hirai, Sendai (JP); Noriaki Shindo, Sapporo (JP); Mitsuhiko Manpo, Sapporo (JP); Hiroyuki Otsuki, Sapporo (JP); Yuuji Osada, Natori (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/381,318

(22) Filed: Dec. 16, 2016

(30) Foreign Application Priority Data

Jan. 27, 2016 (JP) .................. 2016-013555

(51) Int. Cl.
| | |
|---|---|
| H03F 1/32 | (2006.01) |
| H03F 3/19 | (2006.01) |
| H03F 3/24 | (2006.01) |
| H04B 1/04 | (2006.01) |
| H04L 27/36 | (2006.01) |
| H04B 17/14 | (2015.01) |
| H04L 25/03 | (2006.01) |

(52) U.S. Cl.
CPC ......... *H04B 1/0475* (2013.01); *H03F 1/3247* (2013.01); *H03F 3/19* (2013.01); *H03F 3/245* (2013.01); *H04B 17/14* (2015.01); *H03F 2200/294* (2013.01); *H03F 2200/451* (2013.01); *H04B 2001/0425* (2013.01); *H04B 2001/0433* (2013.01); *H04L 25/03343* (2013.01); *H04L 27/368* (2013.01)

(58) Field of Classification Search
CPC ............... H03F 1/3247; H04B 1/0475; H04B 2001/0425; H04B 2001/0433; H04L 27/368; H04L 25/03343
See application file for complete search history.

(56) References Cited

U.S. PATENT DOCUMENTS

| | | |
|---|---|---|
| 6,690,921 B1 | 2/2004 | Nagayama et al. |
| 2010/0232481 A1* | 9/2010 | Miyashita ................. H03F 1/34 375/219 |

(Continued)

FOREIGN PATENT DOCUMENTS

| | | |
|---|---|---|
| GB | 2265270 | 9/1993 |
| JP | 06-507772 | 9/1994 |

(Continued)

*Primary Examiner* — Ross Varndell
(74) *Attorney, Agent, or Firm* — Fujitsu Patent Center

(57) ABSTRACT

To provide a radio apparatus including an amplifier, a first mixer, an analog-to-digital converter, a distortion compensator, and an oscillator. The amplifier amplifies power of a transmission signal. The mixer unit mixes a feedback signal from the amplifier with a local signal of a predetermined frequency. The analog-to-digital converter performs analog-to-digital conversion on an output signal of the mixer unit. The distortion compensator compensates nonlinear distortion of the amplifier based on a digital signal obtained by performing the analog-to-digital conversion. The oscillator changes a frequency of the local signal to be mixed with the feedback signal in the first mixer in a time division manner, with frequency spacing corresponding to a sampling rate of the analog-to-digital converter.

5 Claims, 15 Drawing Sheets

(56) References Cited

U.S. PATENT DOCUMENTS

| | | | | |
|---|---|---|---|---|
| 2012/0002752 A1* | 1/2012 | Coan | ............. | H03F 1/3247 |
| | | | | 375/297 |
| 2012/0250749 A1* | 10/2012 | Tadano | ............. | H03F 1/02 |
| | | | | 375/224 |
| 2012/0281550 A1* | 11/2012 | Huang | ............. | H04B 1/0475 |
| | | | | 370/249 |
| 2013/0163696 A1* | 6/2013 | Son | ............. | H03F 1/3241 |
| | | | | 375/297 |
| 2014/0072074 A1* | 3/2014 | Utsunomiya | ............. | H04L 27/368 |
| | | | | 375/296 |

FOREIGN PATENT DOCUMENTS

| | | |
|---|---|---|
| JP | 2001-077767 | 3/2001 |
| JP | 2001-217885 | 8/2001 |
| JP | 2002-290166 | 10/2002 |
| JP | 2006-157256 | 6/2006 |
| WO | 93/18581 | 9/1993 |

\* cited by examiner

RADIO APPARATUS

CROSS-REFERENCE TO RELATED APPLICATION

This application is based upon and claims the benefit of priority of the prior Japanese Patent Application No. 2016-013555, filed on Jan. 27, 2016, the entire contents of which are incorporated herein by reference.

FIELD

The embodiments discussed herein are related to a radio apparatus and a distortion compensation method.

BACKGROUND

Conventionally, a radio apparatus in a radio communication system includes an amplifier that amplifies power of a transmission signal. In the radio apparatus, in order to increase power efficiency of the amplifier, the amplifier is generally operated near a saturation region of the amplifier. However, if the amplifier is operated near the saturation region, nonlinear distortion of the amplifier increases. Therefore, in order to suppress the nonlinear distortion and decrease an adjacent channel leakage ratio (ACLR), the radio apparatus is provided with a distortion compensation apparatus that compensates nonlinear distortion.

There is a "predistortion method" as one of distortion compensation methods used in a distortion compensation apparatus. Hereinafter, "predistortion" may be referred to as "PD". A distortion compensation apparatus of a PD method suppresses distortion of an output of an amplifier by multiplying beforehand a transmission signal before input to the amplifier by a distortion compensation coefficient having inverse characteristics of nonlinear distortion of the amplifier to increase the linearity of the output of the amplifier. A signal after multiplying the transmission signal by the distortion compensation coefficient may be referred to as "predistortion signal (PD signal)". Accordingly, the PD signal is a signal distorted beforehand according to the inverse characteristics of the nonlinear distortion of the amplifier before being input to the amplifier.

For example, as the distortion compensation apparatus of a PD method, there is an apparatus that has a table in which a plurality of distortion compensation coefficients are stored and reads out a distortion compensation coefficient depending on the power of the transmission signal from the table. The distortion compensation coefficients stored in the table are sequentially updated so that an error between a transmission signal as a reference signal and a signal output from the amplifier and fed back (hereinafter, "feedback signal") becomes minimum.

FIG. 1 is an explanatory diagram of the problem. If an amplifier is operated in a nonlinear region with respect to a transmission signal, an inter modulation distortion (hereinafter, "IM") being nonlinear distortion may be generated. For example, as illustrated in FIG. 1, if a transmission signal with a central frequency Ftx is amplified in the nonlinear region, a signal output from the amplifier may include IM3 and IM5 that are third-order IM and fifth-order IM, respectively. The IM is generated at frequencies "Ftx±BW" and "Ftx±2BW" away from the central frequency Ftx by an integral multiple of a bandwidth BW of the transmission signal, as illustrated in FIG. 1. It is assumed here that a distortion compensation apparatus compensates the IM up to the IM5. That is, it is assumed that a frequency band subjected to distortion compensation (hereinafter, "distortion compensation band") is a band that covers up to the IM5.

The amplifier amplifies the transmission signal after having been frequency-converted by a frequency converter, for example, by using a local signal corresponding to the central frequency Ftx of the transmission signal. In this case, a feedback signal from the amplifier is frequency-converted by the frequency converter by using the local signal corresponding to the central frequency Ftx of the transmission signal, analog-to-digital converted by an analog to digital converter (ADC), and input to the distortion compensation apparatus. A frequency band subjected to the analog-to-digital conversion by the ADC (hereinafter, "AD conversion band") is generally set, matched with the "distortion compensation band" described above. However, because the "distortion compensation band" is set so that all the IMs are compensated, the bandwidth of a "distortion compensation band" becomes wider as a bandwidth BW of the transmission signal becomes wider, and thus the bandwidth of the "AD conversion band" also becomes wide equally to the "distortion compensation band". For example, if the bandwidth of the "distortion compensation band" is as illustrated in FIG. 1, the bandwidth of the "AD conversion band" becomes "5BW", which is five times the bandwidth BW of the transmission signal. Generally, as the bandwidth of the "AD conversion band" becomes wider, the price of the ADC increases. As a result, it becomes difficult to compensate nonlinear distortion of an amplifier by using an inexpensive ADC.

SUMMARY

According to an aspect of an embodiment, a radio apparatus includes an amplifier that amplifies power of a transmission signal; a first mixer that mixes a feedback signal from the amplifier with a local signal of a predetermined frequency; an analog-to-digital converter that performs analog-to-digital conversion on an output signal of the first mixer; a distortion compensator that compensates nonlinear distortion of the amplifier based on a digital signal obtained by performing the analog-to-digital conversion; and an oscillator that changes a frequency of the local signal to be mixed with the feedback signal in the first mixer in a time division manner, with frequency spacing corresponding to a sampling rate of the analog-to-digital converter.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT(S)

Preferred embodiments of the present invention will be explained with reference to accompanying drawings. The disclosed techniques are not limited to the embodiments. Configurations having identical functions among the embodiments are denoted by like reference signs and redundant explanations thereof will be omitted.

[a] First Embodiment

Figure 1:
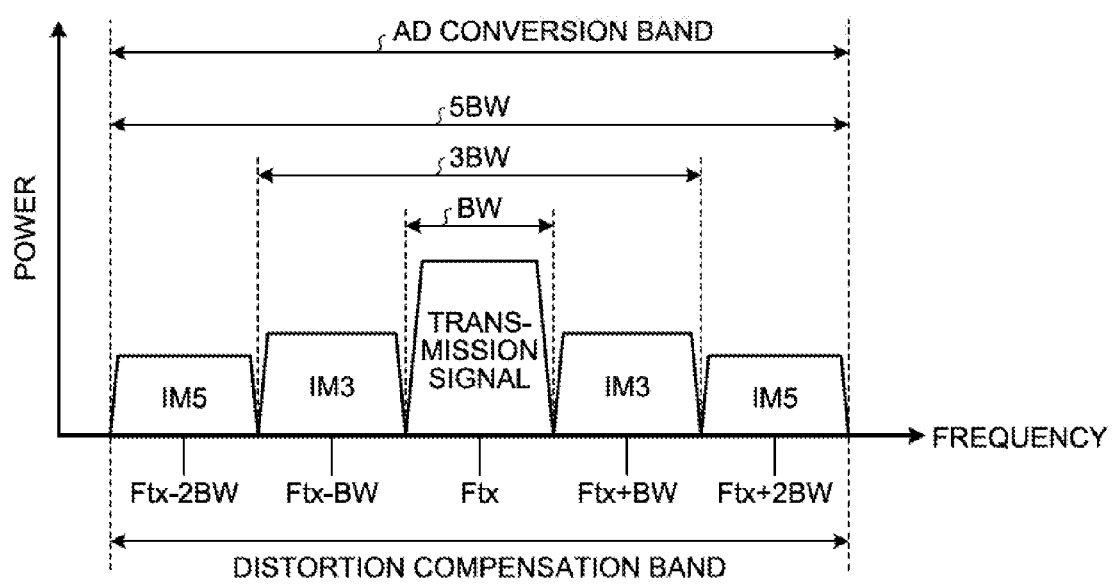
FIG. 1 is an explanatory diagram of the problem.
Figure 2:
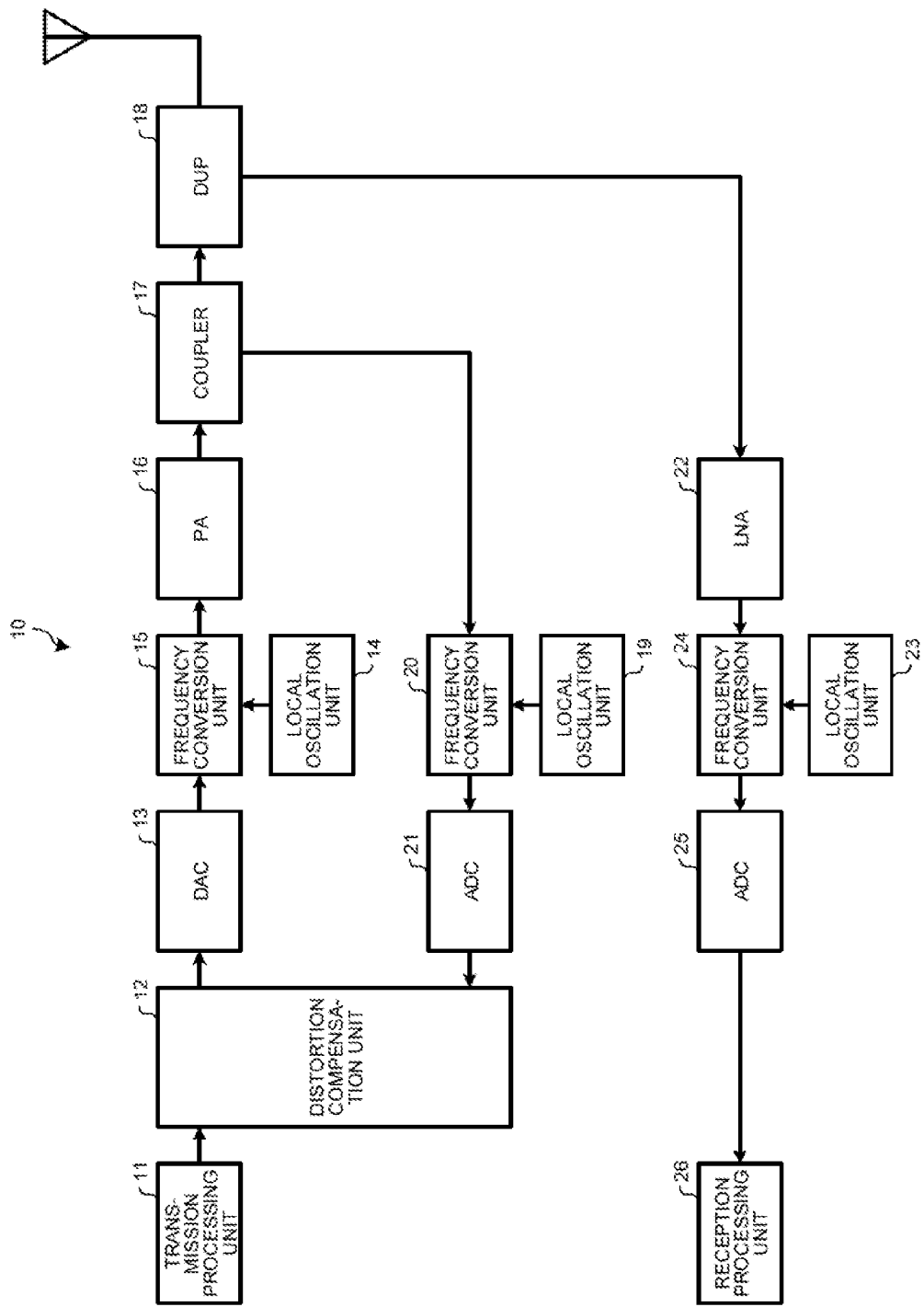
FIG. 2 is a block diagram illustrating an example of a radio apparatus according to a first embodiment.

FIG. 2 is a block diagram illustrating an example of a radio apparatus according to a first embodiment. In FIG. 2, a radio apparatus 10 includes a transmission processing unit 11, a distortion compensation unit 12, a digital to analog converter (DAC) 13, a local oscillation unit 14, a frequency conversion unit 15, a power amplifier (PA) 16, and a coupler 17. The radio apparatus 10 also includes a duplexer (DUP) 18, a local oscillation unit 19, a frequency conversion unit 20, and an analog to digital converter (ADC) 21. The radio apparatus 10 further includes a low noise amplifier (LNA) 22, a local oscillation unit 23, a frequency conversion unit 24, an ADC 25, and a reception processing unit 26.

The transmission processing unit 11 performs transmission processing such as encoding processing and modulation processing with respect to transmission data to be input to generate a transmission signal, and outputs the generated transmission signal to the distortion compensation unit 12.

The distortion compensation unit 12 performs PD with respect to a transmission signal by using a distortion compensation coefficient to compensate nonlinear distortion in the PA 16 (that is, the IM generated in a signal after having been amplified by the PA 16). The distortion compensation unit 12 includes a table in which a plurality of distortion compensation coefficients are stored. The distortion compensation unit 12 reads out a distortion compensation coefficient depending on the power of the transmission signal from the table, multiplies the transmission signal by the distortion compensation coefficient, and outputs the transmission signal after the PD to the DAC 13. Further, the distortion compensation unit 12 updates the distortion compensation coefficient stored in the table based on an error between the transmission signal as a reference signal and a feedback signal input from the ADC 21.

The DAC 13 performs digital-to-analog conversion on the transmission signal input from the distortion compensation unit 12, and outputs an analog transmission signal to the frequency conversion unit 15.

The local oscillation unit 14 generates a local signal corresponding to the central frequency Ftx of the transmission signal, and outputs the generated local signal to the frequency conversion unit 15.

The frequency conversion unit 15 frequency-converts the transmission signal input from the DAC 13 by using the local signal input from the local oscillation unit 14, and outputs the frequency-converted transmission signal to the PA 16.

The PA 16 amplifies the power of the frequency-converted transmission signal and outputs the amplified transmission signal to the coupler 17. It is assumed that the IM3 and IM5 are included in the transmission signal output from the PA 16. The IM3 and IM5 are generated respectively at the frequencies "Ftx±BW" and "Ftx±2BW" away from the central frequency Ftx by the integral multiple of the bandwidth BW of the transmission signal.

The coupler 17 distributes the amplified transmission signal output from the PA 16 to the DUP 18 and the frequency conversion unit 20. Accordingly, the transmission signal output from the PA 16 is fed back to the distortion compensation unit 12 via the frequency conversion unit 20 and the ADC 21. Hereinafter, a signal to be fed back from the PA 16 to the distortion compensation unit 12 is referred to as "feedback signal". An IM3 component and an IM5 component corresponding to the IM3 and the IM5 are included in the feedback signal. The IM3 component and the IM5 component are respectively generated at the frequencies "Ftx±BW" and "Ftx±2BW" away from the central frequency Ftx by the integral multiple of the bandwidth BW of the transmission signal.

The DUP 18 transmits the amplified transmission signal input from the coupler 17 via an antenna. The DUP 18 outputs a reception signal received via the antenna to the LNA 22.

The local oscillation unit 19 generates a first local signal having the central frequency Ftx of the transmission signal and a second local signal having frequencies "Ftx±BW" and "Ftx±2BW" away from the central frequency Ftx by the integral multiple of the bandwidth BW of the transmission signal in a time division manner. The local oscillation unit 19 outputs the generated first local signal and second local signal to the frequency conversion unit 20.

The frequency conversion unit 20 frequency-converts the feedback signal input from the coupler 17 by sequentially using the first local signal and the second local signal in a time division manner, and outputs the frequency-converted first signal and the frequency-converted second signal to the ADC 21. Specifically, the frequency conversion unit 20 frequency-converts the feedback signal by using the first local signal, and outputs the frequency-converted first signal in which a main signal component corresponding to the transmission signal falls within the "AD conversion band" to the ADC 21. The frequency conversion unit 20 also frequency-converts the feedback signal by using the second local signal, and outputs the frequency-converted second signal in which the IM3 component and the IM5 component fall within the "AD conversion band" to the ADC 21. The "AD conversion band" here is a frequency band in which analog-to-digital conversion is performed by the ADC 21, and has a predetermined bandwidth corresponding to the transmission signal. Generally, the predetermined bandwidth is narrower than the bandwidth of the "distortion compensation band", however in the first embodiment, it is assumed to be the same as the bandwidth BW of the transmission signal.

The ADC 21 performs analog-to-digital conversion on the frequency-converted first signal and the frequency-converted second signal respectively in the "AD conversion band", and sequentially outputs the analog-to-digital converted first signal and second signal to the distortion compensation unit 12. Specifically, the ADC 21 performs analog-to-digital conversion on a main signal component of the frequency-converted first signal and the IM3 component and the IM5 component of the frequency-converted second signal in the "AD conversion band". The ADC 21 sequentially outputs the analog-to-digital converted main signal component, IM3 component, and IM5 component to the distortion compensation unit 12 as a feedback signal. Accordingly, the distortion compensation coefficient is updated in the distortion compensation unit 12 so that an error between the sum of the main signal component, the IM3 component, and the IM5 component and the transmission signal decreases. In this manner, the main signal component, the IM3 component, and the IM5 component are individually output to the distortion compensation unit 12, and the distortion compensation coefficient is updated in the distortion compensation unit 12, thereby enabling to realize distortion compensation using an inexpensive ADC 21 having a narrow "AD conversion band".

The LNA 22 amplifies the power of the reception signal input from the DUP 18, and outputs the amplified reception signal to the frequency conversion unit 24.

The local oscillation unit 23 generates a local signal corresponding to a central frequency Frx of the reception signal, and outputs the generated local signal to the frequency conversion unit 24.

The frequency conversion unit 24 frequency-converts the reception signal input from the LNA 22 by using the local signal input from the local oscillation unit 23, and outputs the frequency-converted reception signal to the ADC 25.

The ADC 25 performs analog-to-digital conversion on the frequency-converted reception signal, and outputs the analog-to-digital converted reception signal to the reception processing unit 26.

The reception processing unit 26 performs reception processing such as demodulation processing and decoding processing with respect to the reception signal input from the ADC 25 to acquire reception data.

Operation Example of Radio Apparatus

Figure 3:
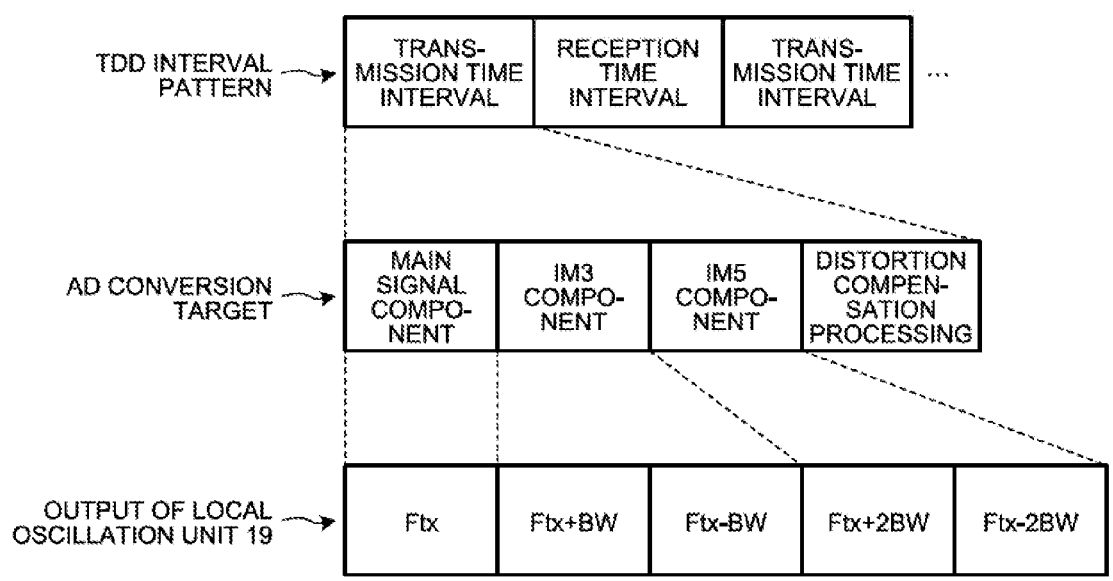
FIG. 3 is a timing chart illustrating an example of a processing operation of the radio apparatus according to the first embodiment.
Figure 4:
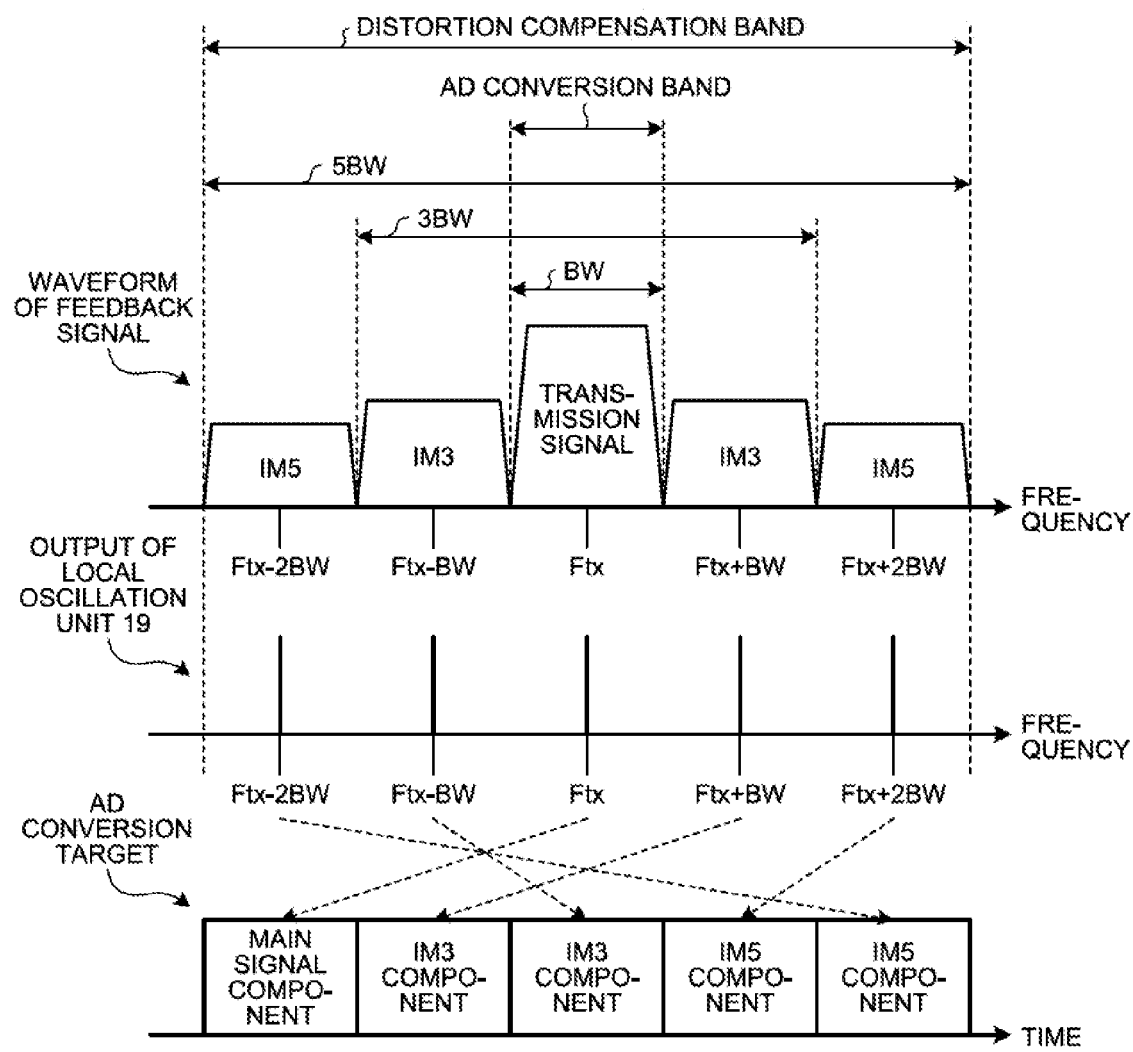
FIG. 4 is an explanatory diagram of the processing operation of the radio apparatus according to the first embodiment.

An example of a processing operation of the radio apparatus 10 having the configuration described above is described. FIG. 3 is a timing chart illustrating an example of the processing operation of the radio apparatus according to the first embodiment. FIG. 4 is an explanatory diagram of the processing operation of the radio apparatus according to the first embodiment. It is assumed here that a time-division duplexing (TDD) method is applied to the radio apparatus 10.

As illustrated in FIG. 3, in a transmission time interval of a TDD method, the local oscillation unit 19 generates the first local signal having the central frequency Ftx of the transmission signal and the second local signal having the frequencies "Ftx±BW" and "Ftx±2BW" in a time division manner.

Subsequently, the frequency conversion unit 20 frequency-converts the feedback signal by sequentially using the first local signal and the second local signal in a time division manner, and outputs the frequency-converted first signal and the frequency-converted second signal to the ADC 21. That is, the frequency conversion unit 20 frequency-converts the feedback signal by using the first local signal, and outputs the frequency-converted first signal in which the main signal component corresponding to the transmission signal falls within the "AD conversion band" to the ADC 21. The frequency conversion unit 20 also frequency-converts the feedback signal by using the second local signal, and outputs the frequency-converted second signal in which the IM3 component and the IM5 component fall within the "AD conversion band" to the ADC 21. As illustrated in FIG. 4, the bandwidth of the "AD conversion band" is the same as the bandwidth BW of the transmission signal. Therefore, the main signal component of the frequency-converted first signal and the IM3 component and the IM5 component of the frequency-converted second signal individually become an analog-to-digital conversion target by the ADC 21.

Subsequently, the ADC 21 respectively performs analog-to-digital conversion on the frequency-converted first signal and the frequency-converted second signal in the "AD conversion band", and sequentially outputs the analog-to-digital converted first signal and second signal to the distortion compensation unit 12. That is, the ADC 21 performs analog-to-digital conversion on the main signal component of the frequency-converted first signal and the IM3 component and the IM5 component of the frequency-converted second signal respectively in the "AD conversion band". The ADC 21 sequentially outputs the analog-to-digital converted main signal component, IM3 component, and IM5 component to the distortion compensation unit 12 as a feedback signal.

Subsequently, the distortion compensation unit 12 updates the distortion compensation coefficient so that the error between the sum of the analog-to-digital converted main signal component, IM3 component, and IM5 component and the transmission signal decreases. The distortion compensation unit 12 performs PD with respect to the transmission signal by using the updated distortion compensation coefficient to compensate nonlinear distortion in the PA 16 (that is, IM3 and IM5). The PD processing procedure described above is repeatedly performed at every cycle of the transmission time interval of the TDD method.

As described above, according to the first embodiment, in the radio apparatus 10, the PA 16 amplifies the power of a transmission signal. The local oscillation unit 19 generates a first local signal having the central frequency Ftx of the transmission signal and a second local signal having frequencies away from the central frequency Ftx by the integral multiple of the bandwidth BW of the transmission signal in a time division manner. The frequency conversion unit 20 frequency-converts a feedback signal from the PA 16 by sequentially using the first local signal and the second local signal in a time division manner, and outputs the frequency-converted first signal and the frequency-converted second signal. The ADC 21 performs analog-to-digital conversion on the first signal and the second signal respectively in an "AD conversion band". The "AD conversion band" is a frequency band including the central frequency Ftx of the transmission signal and having a predetermined bandwidth (that is, the bandwidth BW of the transmission signal). The distortion compensation unit 12 compensates nonlinear distortion of the PA 16 (that is, IM3 and IM5) based on the analog-to-digital converted first signal and second signal, and the transmission signal.

According to the configuration of the radio apparatus 10, the main signal component, the IM3 component, and the IM5 component can be individually output to the distortion compensation unit 12, to update the distortion compensation coefficient. Even if the "AD conversion band" of the ADC 21 is narrower than the "distortion compensation band", nonlinear distortion of the PA 16 can be compensated. As a result, nonlinear distortion of the PA 16 can be compensated by using an inexpensive ADC 21.

[b] Second Embodiment

In a second embodiment, a radio apparatus not only compensates nonlinear distortion of the PA 16, but also corrects amplitude deviation with respect to respective frequencies of a reception signal, a feedback signal, and a transmission signal.

Figure 5:
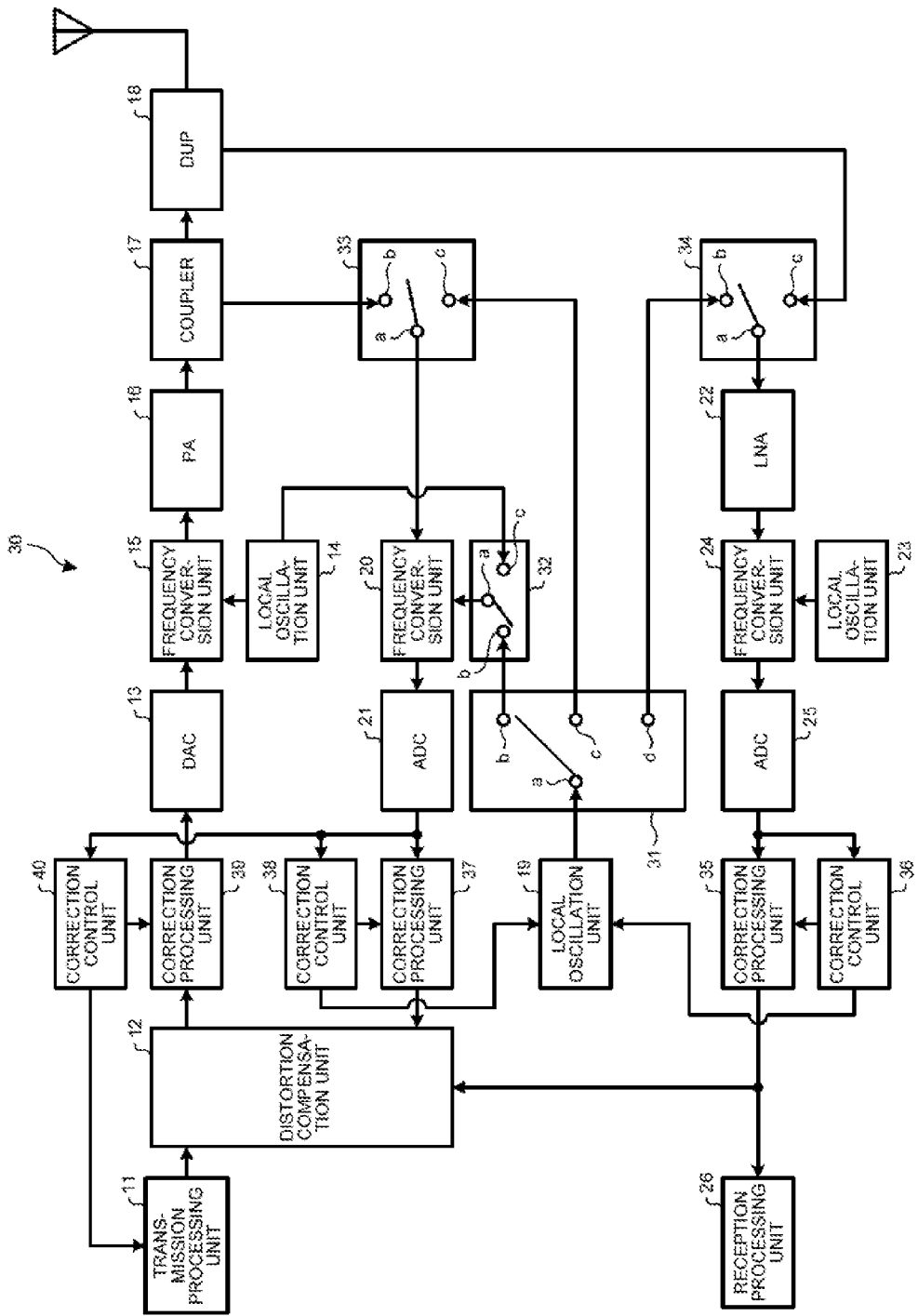
FIG. 5 is a block diagram illustrating an example of a radio apparatus according to a second embodiment.

FIG. 5 is a block diagram illustrating an example of the radio apparatus according to the second embodiment. In a radio apparatus 30 illustrated in FIG. 5, the local oscillation unit 19 generates a first local signal and a second local signal in a time division manner in a "distortion-compensation processing period" that is a period for compensating nonlinear distortion of the PA 16, as in the local oscillation unit 19 according to the first embodiment. The local oscillation unit 19 outputs the generated first local signal and second local signal to the frequency conversion unit 20 via switches 31 and 32 described later.

In a "reception-correction processing period", the local oscillation unit 19 generates a third local signal that sweeps a reception band, which is a frequency range of a reception signal to be transferred via a "reception path", with predetermined frequency spacing according to control of a correction control unit 36. The "reception-correction processing period" is a period for correcting amplitude deviation in the reception band. The third local signal has, for example, a frequency range same as that of the reception band of the reception signal. The third local signal can include a plurality of continuous wave (CW) signals respectively corresponding to a plurality of frequency points in the reception band. For example, the local oscillation unit 19 generates the CW signals in the order of having a low frequency as the third local signal. The local oscillation unit 19 outputs the generated third local signal to the "reception path" via the switch 31 and a switch 34 described later. The "reception path" described above is a path including the LNA 22, the frequency conversion unit 24, and the ADC 25.

In an "FB-correction processing period", the local oscillation unit 19 generates a fourth local signal that sweeps a frequency band, which is a frequency band of a feedback signal, via a "feedback path" with predetermined frequency spacing, according to control of a correction control unit 38. The "FB-correction processing period" is a period for correcting amplitude deviation in the feedback band. The fourth local signal has, for example, a frequency range same as that of the feedback band of the feedback signal. The fourth local signal can include a plurality of CW signals respectively corresponding to a plurality of frequency points in the feedback band. The local oscillation unit 19 generates the CW signals, for example, in the order of having a low frequency as the fourth local signal. The local oscillation unit 19 outputs the generated fourth local signal to the "feedback path" via the switch 31 and a switch 33 described later. The "feedback path" described above is a path including the frequency conversion unit 20 and the ADC 21.

In the radio apparatus 30 illustrated in FIG. 5, the transmission processing unit 11 generates a transmission signal or a "test signal" and outputs the signal to the distortion compensation unit 12. In an "FW-correction processing period", the transmission processing unit 11 generates a fifth local signal that sweeps a transmission band, which is a frequency range of a transmission signal, with predetermined frequency spacing as a "test signal" according to control of a correction control unit 40. The "FW-correction processing period" is a period for correcting amplitude deviation in the transmission band. The fifth local signal has, for example, a frequency range same as that of the transmission band of the transmission signal. The fifth local signal can include a plurality of CW signals respectively corresponding to a plurality of frequency points in the transmission band. The transmission processing unit 11 generates the CW signals, for example, in the order of having a low frequency as the fifth local signal. The transmission processing unit 11 outputs the generated fifth local signal to a "transmission path". The "transmission path" described above is a path including the DAC 13, the frequency conversion unit 15 and the PA 16.

In FIG. 5, the radio apparatus 30 includes the switches 31, 32, 33, and 34, a correction processing unit 35, the correction control unit 36, a correction processing unit 37, the correction control unit 38, a correction processing unit 39, and the correction control unit 40.

The switch 31 includes an input terminal a, and output terminals b, c, and d. The input terminal a of the switch 31 is connected with an output of the local oscillation unit 19. The output terminal b of the switch 31 is connected with an input terminal b of the switch 32. The output terminal c of the switch 31 is connected with an input terminal c of the switch 33. The output terminal d of the switch 31 is connected with an input terminal b of the switch 34. In the "distortion-compensation processing period", the input terminal a of the switch 31 is connected with the output terminal b of the switch 31. In the "reception-correction processing period", the input terminal a of the switch 31 is connected with the output terminal d of the switch 31. Further, in the "FB-correction processing period" for correcting amplitude deviation in the feedback band being the frequency range of the feedback signal, the input terminal a of the switch 31 is connected with the output terminal c of the switch 31. The connection state of the switch 31 is switched according to control of a switch control unit (not illustrated). A state where the input terminal a of the switch 31 is connected with the output terminal b of the switch 31 is referred to as "first state" of the switch 31. A state where the input terminal a of the switch 31 is connected with the output terminal d of the switch 31 is referred to as "second state" of the switch 31. A state where the input terminal a of the switch 31 is connected with the output terminal c of the switch 31 is referred to as "third state" of the switch 31.

The switch 32 includes an output terminal a, the input terminal b, and an input terminal c. The output terminal a of the switch 32 is connected with an input of the frequency conversion unit 20. The input terminal b of the switch 32 is connected with the output terminal b of the switch 31. The input terminal c of the switch 32 is connected with an output of the local oscillation unit 14. In the "distortion-compensation processing period", the output terminal a of the switch 32 is connected with the input terminal b of the switch 32. In the periods other than the "distortion-compensation processing period", the output terminal a of the switch 32 is connected with the input terminal c of the switch 32. The periods other than the "distortion-compensation processing period" include the "FW-correction processing period". The connection state of the switch 32 is switched by the switch control unit described above. A state where the output terminal a of the switch 32 is connected with the input terminal b of the switch 32 is referred to as "first state" of the switch 32. A state where the output terminal a of the switch 32 is connected with the input terminal c of the switch 32 is referred to as "second state" of the switch 32.

The switch 33 includes an output terminal a, an input terminal b, and the input terminal c. The output terminal a of the switch 33 is connected with the input of the frequency conversion unit 20. The input terminal b of the switch 33 is connected with an output of the coupler 17. The input terminal c of the switch 33 is connected with the output terminal c of the switch 31. In the "FB-correction processing period", the output terminal a of the switch 33 is connected with the input terminal c of the switch 33. In the periods other than the "FB-correction processing period", the output terminal a of the switch 33 is connected with the input terminal b of the switch 33. The periods other than the "FB-correction processing period" include the "distortion-compensation processing period" and the "FW-correction processing period". The connection state of the switch 33 is switched by the switch control unit described above. A state where the output terminal a of the switch 33 is connected with the input terminal c of the switch 33 is referred to as "first state" of the switch 33. A state where the output terminal a of the switch 33 is connected with the input terminal b of the switch 33 is referred to as "second state" of the switch 33.

The switch 34 includes an output terminal a, the input terminal b, and an input terminal c. The output terminal a of the switch 34 is connected with an output of the LNA 22. The input terminal b of the switch 34 is connected with the output terminal d of the switch 31. The input terminal c of the switch 34 is connected with an output of the DUP 18. In the "reception-correction processing period", the output terminal a of the switch 34 is connected with the input terminal b of the switch 34. In the periods other than the "reception-correction processing period", the output terminal a of the switch 34 is connected with the input terminal c of the switch 34. The connection state of the switch 34 is switched by the switch control unit described above. A state where the output terminal a of the switch 34 is connected with the input terminal b of the switch 34 is referred to as "first state" of the switch 34. A state where the output terminal a of the switch 34 is connected with the input terminal c of the switch 34 is referred to as "second state" of the switch 34.

The correction processing unit 35 is connected with an output of the ADC 25, corrects amplitude deviation in the reception band being a frequency range of the reception signal received from the ADC 25 by using a "first correction coefficient", and outputs the reception signal having been subjected to the correction processing to the reception processing unit 26. The correction processing unit 35 also modifies (adjusts) the "first correction coefficient" based on a "first adjustment value" received from the correction control unit 36. The correction processing unit 35 is, for example, a finite impulse response filter (FIR).

The correction control unit 36 adjusts the first correction coefficient of the correction processing unit 35. Specifically, the correction control unit 36 sets the switch 31 to the second state and sets the switch 34 to the first state in cooperation with the switch control unit in the "reception-correction processing period", and causes the local oscillation unit 19 to generate the third local signal. Accordingly, in the "reception-correction processing period", the third local signal is input to the correction control unit 36 via the "reception path". The correction control unit 36 detects amplitude deviation in the frequency range (that is, in the reception band) of the third local signal received via the "reception path" (hereinafter, "first amplitude deviation" as appropriate) in the "reception-correction processing period". That is, the correction control unit 36 detects an amplitude value of each CW signal received via the "reception path". The correction control unit 36 then adjusts the first correction coefficient of the correction processing unit 35 based on the detected first amplitude deviation of the third local signal. That is, in the "reception-correction processing period", correction of amplitude deviation of the reception signal arising from the "reception path" described above is performed.

For example, in the "reception-correction processing period", the correction control unit 36 derives an "approximate straight line" with regard to the amplitude value of the third local signal corresponding to respective frequencies in the "reception band" in the first amplitude deviation. The correction control unit 36 derives a "reverse approximate straight line" by reversing the sign of inclination of the derived "approximate straight line". The correction control unit 36 calculates the "first adjustment value" of the first correction coefficient of the correction processing unit 35 based on the derived "reverse approximate straight line". The correction control unit 36 then outputs the calculated "first adjustment value" of the first correction coefficient of the correction processing unit 35 to the correction processing unit 35.

The correction processing unit 37 is connected with an output of the ADC 21, corrects amplitude deviation in the feedback band being a frequency range of the feedback signal received from the ADC 21 by using a "second correction coefficient", and outputs the feedback signal having been subjected to the correction processing to the distortion compensation unit 12. The correction processing unit 37 also modifies (adjusts) the "second correction coefficient" based on a "second adjustment value" received from the correction control unit 38. The correction processing unit 37 is, for example, an FIR.

The correction control unit 38 adjusts the second correction coefficient of the correction processing unit 37. Specifically, the correction control unit 38 sets the switch 31 to the third state and sets the switch 33 to the first state in cooperation with the switch control unit in the "FB-correction processing period", and causes the local oscillation unit 19 to generate the fourth local signal. Accordingly, in the "FB-correction processing period", the fourth local signal is input to the correction control unit 38 via the "feedback path". The correction control unit 38 detects amplitude deviation in the frequency range (that is, in the feedback band) of the fourth local signal received via the "feedback path" (hereinafter, "second amplitude deviation" as appropriate) in the "FB-correction processing period". That is, the correction control unit 38 detects an amplitude value of each CW signal received via the "feedback path". The correction control unit 38 then adjusts the second correction coefficient of the correction processing unit 37 based on the detected second amplitude deviation of the fourth local signal. That is, in the "FB-correction processing period", correction of the amplitude deviation of the feedback signal arising from the "feedback path" described above is performed.

For example, in the "FB-correction processing period", the correction control unit 38 derives an "approximate straight line" with regard to the amplitude value of the fourth local signal corresponding to respective frequencies in the "feedback band" in the second amplitude deviation. The correction control unit 38 derives a "reverse approximate straight line" by reversing the sign of inclination of the derived "approximate straight line". The correction control unit 38 calculates the "second adjustment value" of the second correction coefficient of the correction processing unit 37 based on the derived "reverse approximate straight line". The correction control unit 38 then outputs the calculated "second adjustment value" of the second correction coefficient of the correction processing unit 37 to the correction processing unit 37.

The correction processing unit 39 is connected with an input of the DAC 13, corrects amplitude deviation in the transmission band being the frequency range of the transmission signal received from the transmission processing unit 11 via the distortion compensation unit 12 by using a "third correction coefficient", and outputs the transmission signal having been subjected to the correction processing to the DAC 13. The correction processing unit 39 also modifies (adjusts) the "third correction coefficient" based on a "third adjustment value" received from the correction control unit 40. The correction processing unit 39 is, for example, an FIR.

The correction control unit 40 adjusts the third correction coefficient of the correction processing unit 39. Specifically, the correction control unit 40 sets the switch 32 to the second state and sets the switch 33 to the second state in cooperation with the switch control unit in the "FW-correction processing period", and causes the transmission processing unit 11 to generate the fifth local signal. Accordingly, in the "FW-correction processing period", the fifth local signal is input to the correction control unit 40 via the "transmission path" and the "feedback path". The correction control unit 40 detects amplitude deviation in the frequency range (that is, in the transmission band) of the fifth local signal received via the "transmission path" and the "feedback path" (hereinafter, "third amplitude deviation" as appropriate) in the "FW-correction processing period". That is, the correction control unit 40 detects an amplitude value of each CW signal received via the "transmission path" and the "feedback path". The correction control unit 40 then adjusts the third correction coefficient of the correction processing unit 39 based on the detected third amplitude deviation of the fifth local signal. That is, in the "FW-correction processing period", correction of amplitude deviation arising from both the "transmission path" and the "feedback path" described above is performed. However, because correction of amplitude deviation arising from the "feedback path" has been already performed in the "FB-correction processing period", practically, only correction of the amplitude deviation arising from the "transmission path" is performed in the "FW-correction processing period".

For example, in the "FW-correction processing period", the correction control unit 40 derives an "approximate straight line" with regard to the amplitude value of the fifth local signal corresponding to respective frequencies in the "transmission band" in the third amplitude deviation. The correction control unit 40 derives a "reverse approximate straight line" by reversing the sign of inclination of the derived "approximate straight line". The correction control unit 40 calculates the "third adjustment value" of the third correction coefficient of the correction processing unit 39 based on the derived "reverse approximate straight line". The correction control unit 40 then outputs the calculated "third adjustment value" of the third correction coefficient of the correction processing unit 39 to the correction processing unit 39.

Operation Example of Radio Apparatus

Figure 6:
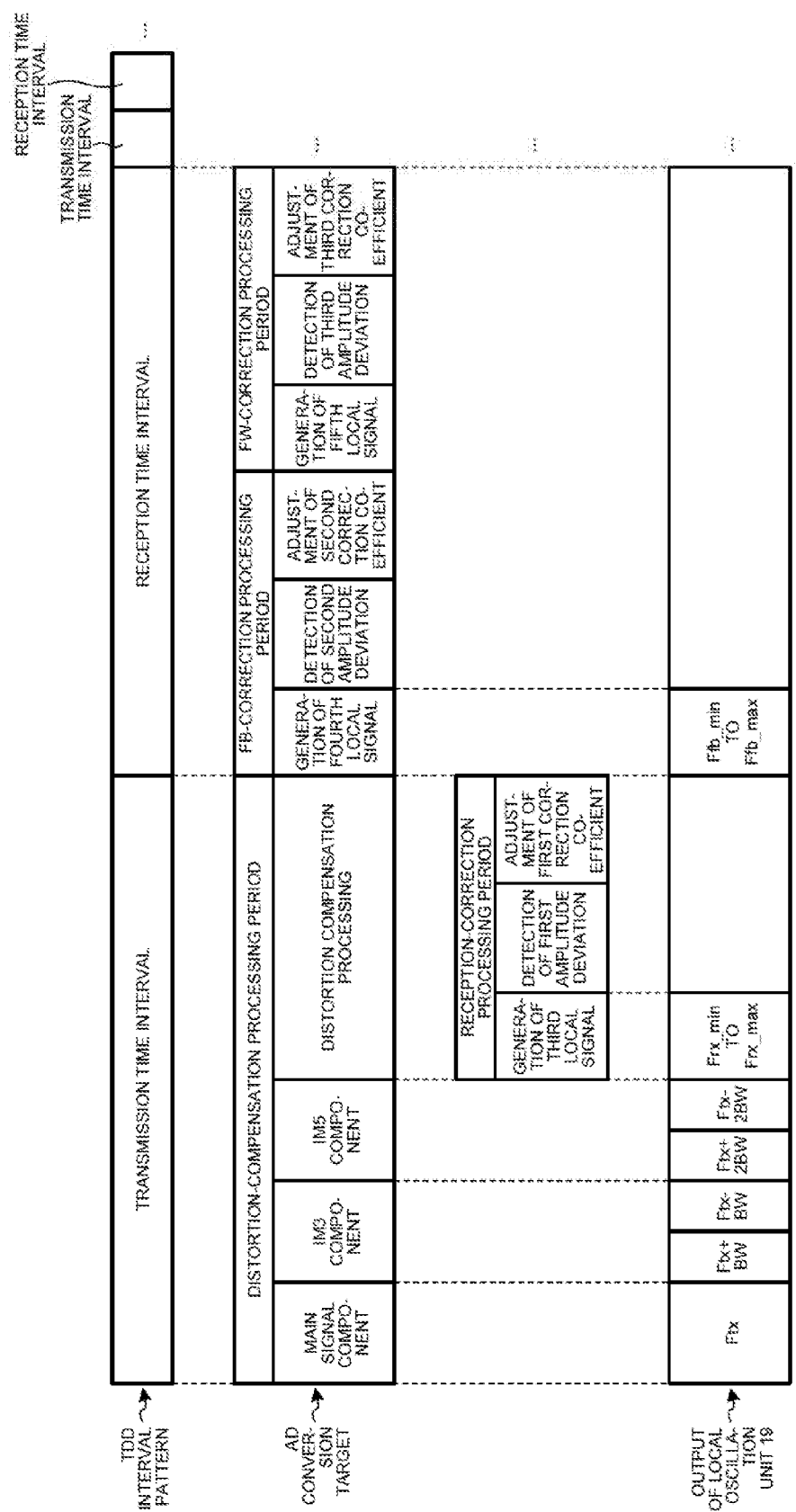
FIG. 6 is a timing chart illustrating an example of a processing operation of the radio apparatus according to the second embodiment.

An example of a processing operation of the radio apparatus 30 having the configuration described above is described. FIG. 6 is a timing chart illustrating an example of the processing operation of the radio apparatus according to the second embodiment. FIGS. 7 to 18 are explanatory diagrams of the processing operation of the radio apparatus according to the second embodiment. It is assumed here that a time-division duplexing (TDD) method is applied to the radio apparatus 30. When the TDD method is applied to the radio apparatus 30, as illustrated in FIG. 6, the "distortion-compensation processing period" and the "reception-correction processing period" are set in a transmission time interval of the TDD method. Further, the "FB-correction processing period" and the "FW-correction processing period" are set in a reception time interval of the TDD method.

In the "distortion-compensation processing period" in the transmission time interval of the TDD method, the local oscillation unit 19 generates the first local signal having the central frequency Ftx of the transmission signal and the second local signal having frequencies "Ftx±BW" and "Ftx±2BW" in a time division manner. The switch control unit sets the switch 31 to the first state, sets the switch 32 to the first state, and sets the switch 33 to the second state in the "distortion-compensation processing period". Accordingly, the first local signal, the second local signal, and the feedback signal are input to the frequency conversion unit 20.

Subsequently, the frequency conversion unit 20 frequency-converts the feedback signal by sequentially using the first local signal and the second local signal in a time division manner, and outputs the frequency-converted first signal and the frequency-converted second signal to the ADC 21. That is, the frequency conversion unit 20 frequency-converts the feedback signal by using the first local signal, and outputs the frequency-converted first signal in which the main signal component corresponding to the transmission signal falls within the "AD conversion band" to the ADC 21. The frequency conversion unit 20 also frequency-converts the feedback signal by using the second local signal, and outputs the frequency-converted second signal in which the IM3 component and the IM5 component fall within the "AD conversion band" to the ADC 21. As illustrated in FIG. 4, the bandwidth of the "AD conversion band" is the same as the bandwidth BW of the transmission signal. Therefore, the main signal component of the frequency-converted first signal and the IM3 component and the IM5 component of the frequency-converted second signal individually become an analog-to-digital conversion target by the ADC 21.

Subsequently, the ADC 21 respectively performs analog-to-digital conversion on the frequency-converted first signal and the frequency-converted second signal in the "AD conversion band", and sequentially outputs the analog-to-digital converted first signal and second signal to the distortion compensation unit 12. That is, the ADC 21 performs analog-to-digital conversion on the main signal component of the frequency-converted first signal and the IM3 component and the IM5 component of the frequency-converted second signal respectively in the "AD conversion band". The ADC 21 sequentially outputs the analog-to-digital converted main signal component, IM3 component, and IM5 component to the distortion compensation unit 12 as a feedback signal.

Subsequently, the distortion compensation unit 12 updates the distortion compensation coefficient so that the error between the sum of the analog-to-digital converted main signal, IM3 component, and IM5 component and the transmission signal decreases. The distortion compensation unit 12 performs PD with respect to the transmission signal by using the updated distortion compensation coefficient, to compensate nonlinear distortion in the PA 16 (that is, IM3 and IM5).

Figure 7:
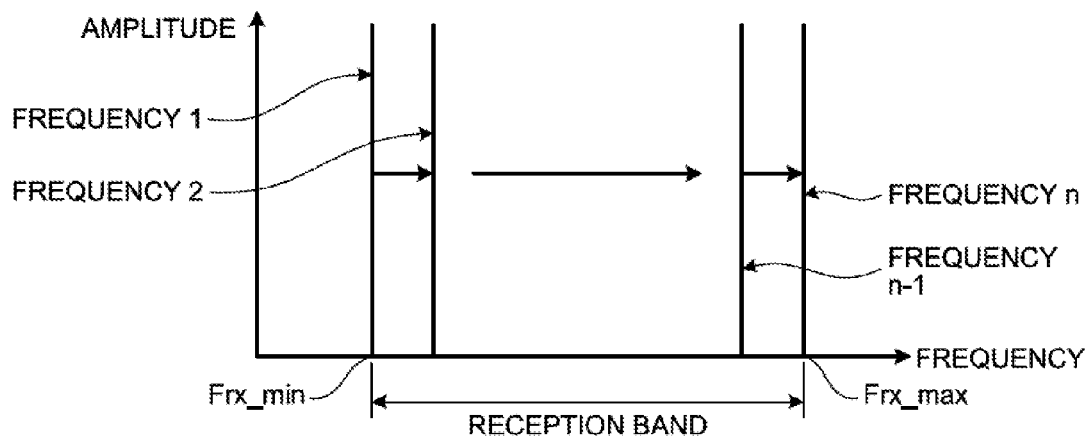
FIG. 7 is an explanatory diagram of the processing operation of the radio apparatus according to the second embodiment.

Subsequently, the local oscillation unit 19 generates the third local signal according to control of the correction control unit 36 in the "reception-correction processing period". As illustrated in FIG. 7, the third local signal includes a plurality of CW signals respectively corresponding to a plurality of frequency points (frequency 1 to frequency n) in the reception band. The frequency 1 corresponds to a minimum value Frx_min of the frequency in the reception band, and the frequency n corresponds to a maximum value Frx_max of the frequency in the reception band. The amplitudes of the CW signals are the same. The local oscillation unit 19 outputs the CW signals in the order of having a low frequency as the third local signal.

The correction control unit 36 sets the switch 31 to the second state and sets the switch 34 to the first state in cooperation with the switch control unit in the "reception-correction processing period". Accordingly, in the "reception-correction processing period", the third local signal is input to the correction control unit 36 via the "reception path".

Figure 8:
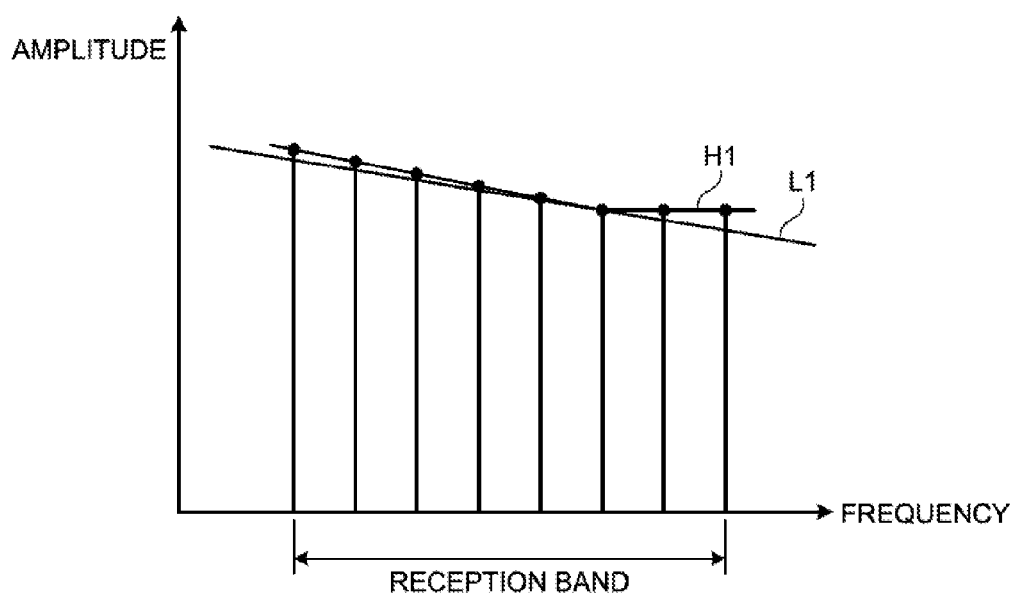
FIG. 8 is an explanatory diagram of the processing operation of the radio apparatus according to the second embodiment.
Figure 9:
FIG. 9 is an explanatory diagram of the processing operation of the radio apparatus according to the second embodiment.

The correction control unit 36 detects first amplitude deviation of the third local signal received via the "reception path" in the "reception-correction processing period". That is, as illustrated in FIG. 8, a curve connecting the amplitude values of the respective CW signals is a first amplitude deviation H1 with respect to the frequency.

The correction control unit 36 adjusts the first correction coefficient of the correction processing unit 35 based on the detected "first amplitude deviation" of the third local signal.

For example, the correction control unit 36 determines whether the "first amplitude deviation" falls within a preset "target amplitude range". That is, the correction control unit 36 determines whether an amplitude value that does not fall within the "target amplitude range" is included in the amplitude values of the respective CW signals received via the "reception path". If the "first amplitude deviation" does not fall within the "target amplitude range", the correction control unit 36 derives an approximate straight line L1, as illustrated in FIG. 8, with regard to the amplitude value of the third local signal corresponding to the respective frequencies in the "reception band" in the first amplitude deviation H1. For example, a least squares method is used for deriving the approximate straight line L1. The correction control unit 36 derives a reverse approximate straight line L2 illustrated in FIG. 9 by reversing the sign of inclination of the derived approximate straight line L1. The correction control unit 36 calculates the "first adjustment value" of the first correction coefficient of the correction processing unit 35 based on the derived reverse approximate straight line L2.

Figure 10:
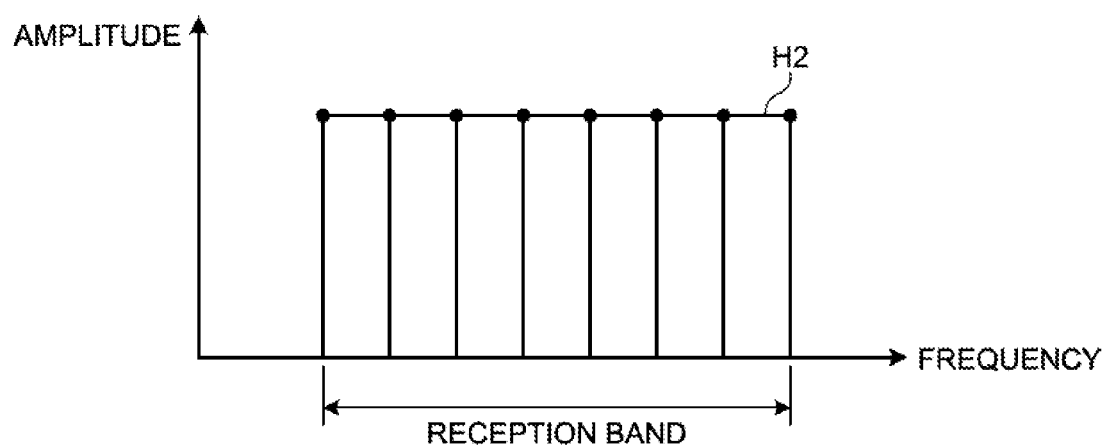
FIG. 10 is an explanatory diagram of the processing operation of the radio apparatus according to the second embodiment.

Because the "reception-correction processing period" described above is repeated at every cycle of the transmission time interval of the TDD method, as illustrated in FIG. 10, a first amplitude deviation H2 with respect to the frequency approaches a straight line parallel to a frequency axis, and falls within the "target amplitude range". If a difference between the respective amplitude values of the first amplitude deviation detected previously and the respective amplitude values of the first amplitude deviation detected this time exceeds a predetermined threshold, the correction control unit 36 detects that a gain of the LNA 22 in the "reception path" has changed, and can output an alarm indicating this matter.

Figure 11:
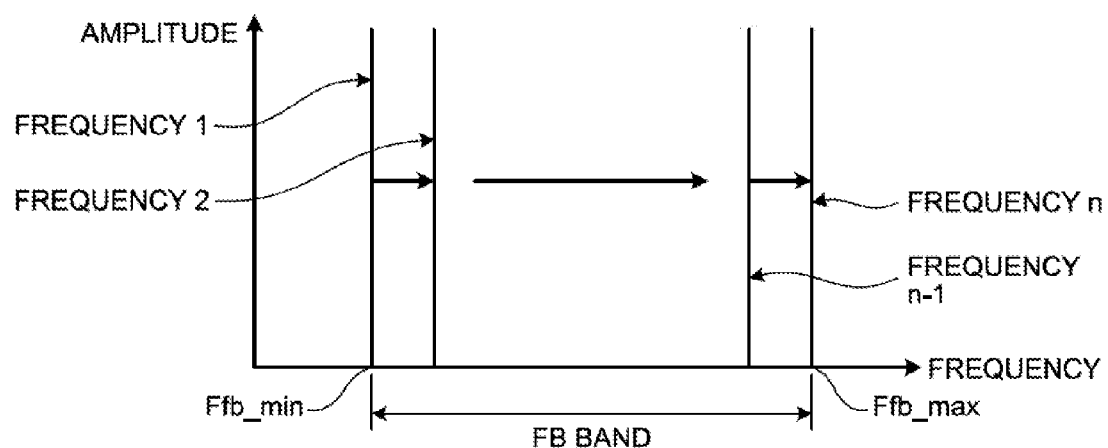
FIG. 11 is an explanatory diagram of the processing operation of the radio apparatus according to the second embodiment.

Subsequently, the local oscillation unit 19 generates the fourth local signal according to control of the correction control unit 38 in the "FB-correction processing period" in a reception time interval of the TDD method. As illustrated in FIG. 11, the fourth local signal includes a plurality of CW signals respectively corresponding to a plurality of frequency points (frequency 1 to frequency n) in the feedback (FB) band. The frequency 1 corresponds to a minimum value Ffb_min of the frequency in the FB band, and the frequency n corresponds to a maximum value Ffb_max of the frequency in the FB band. The amplitudes of the CW signals are the same. The local oscillation unit 19 outputs the CW signals in the order of having a low frequency as the fourth local signal.

The correction control unit 38 sets the switch 31 to the third state and sets the switch 33 to the first state in cooperation with the switch control unit in the "FB-correction processing period". Accordingly, in the "FB-correction processing period", the fourth local signal is input to the correction control unit 38 via the "feedback path".

Figure 12:
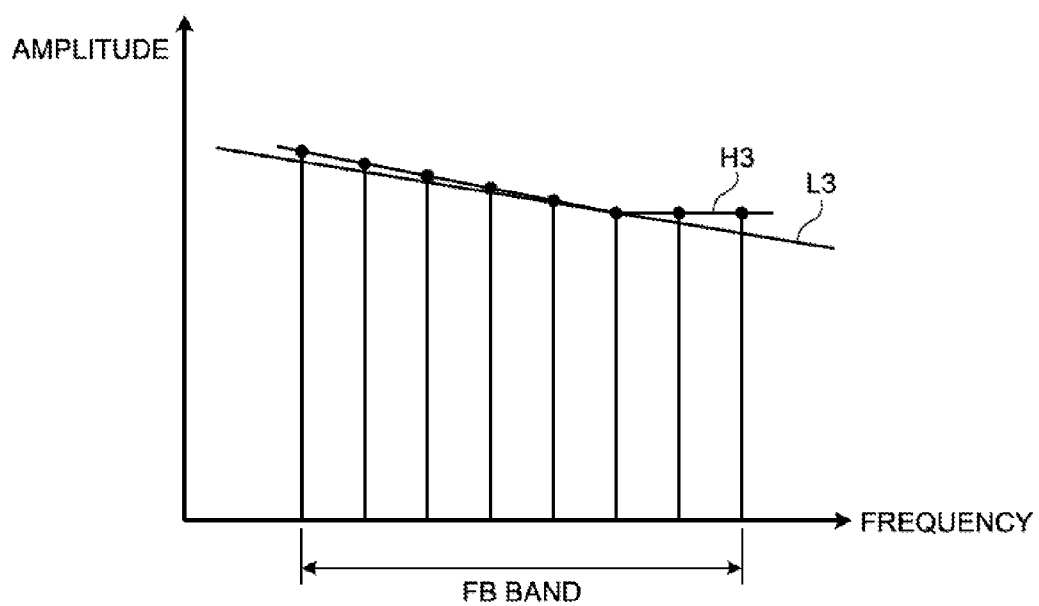
FIG. 12 is an explanatory diagram of the processing operation of the radio apparatus according to the second embodiment.
Figure 13:
FIG. 13 is an explanatory diagram of the processing operation of the radio apparatus according to the second embodiment.

The correction control unit 38 detects second amplitude deviation of the fourth local signal received via the "feedback path" in the "FB-correction processing period". That is, as illustrated in FIG. 12, a curve connecting the amplitude values of the respective CW signals is a second amplitude deviation H3 with respect to the frequency.

The correction control unit 38 adjusts the second correction coefficient of the correction processing unit 37 based on the detected "second amplitude deviation" of the fourth local signal.

For example, the correction control unit 38 determines whether the "second amplitude deviation" falls within a preset "target amplitude range". That is, the correction control unit 38 determines whether an amplitude value that does not fall within the "target amplitude range" is included in the amplitude values of the respective CW signals received via the "feedback path". If the "second amplitude deviation" does not fall within the "target amplitude range", the correction control unit 38 derives an approximate straight line L3, as illustrated in FIG. 12, with regard to the amplitude value of the fourth local signal corresponding to the respective frequencies in the "FB band" in the second amplitude deviation H3. For example, a least squares method is used for deriving the approximate straight line L3. The correction control unit 38 derives a reverse approximate straight line L4 illustrated in FIG. 13 by reversing the sign of inclination of the derived approximate straight line L3. The correction control unit 38 calculates a "second adjustment value" of the second correction coefficient of the correction processing unit 37 based on the derived reverse approximate straight line L4.

Figure 14:
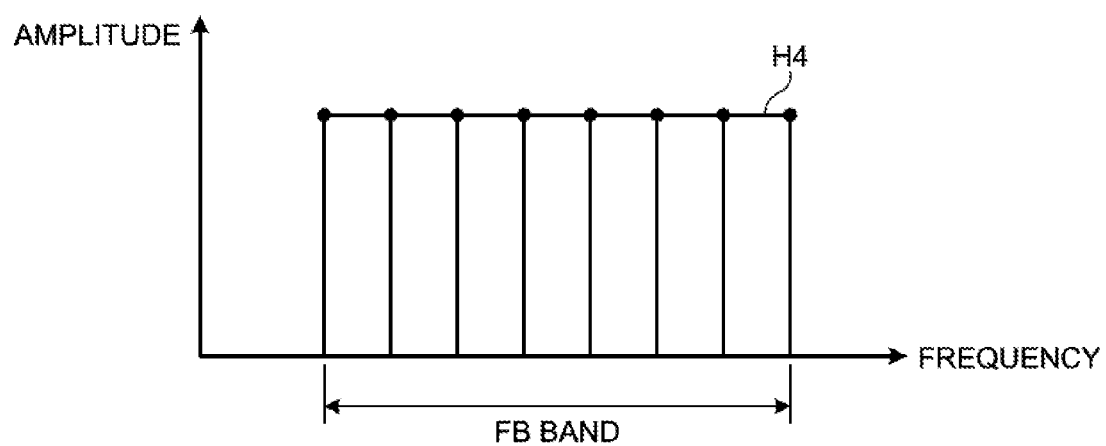
FIG. 14 is an explanatory diagram of the processing operation of the radio apparatus according to the second embodiment.

Because the "FB-correction processing period" described above is repeated at every cycle of the reception time interval of the TDD method, as illustrated in FIG. 14, a second amplitude deviation H4 with respect to the frequency approaches a straight line parallel to the frequency axis, and falls within the "target amplitude range".

Figure 15:
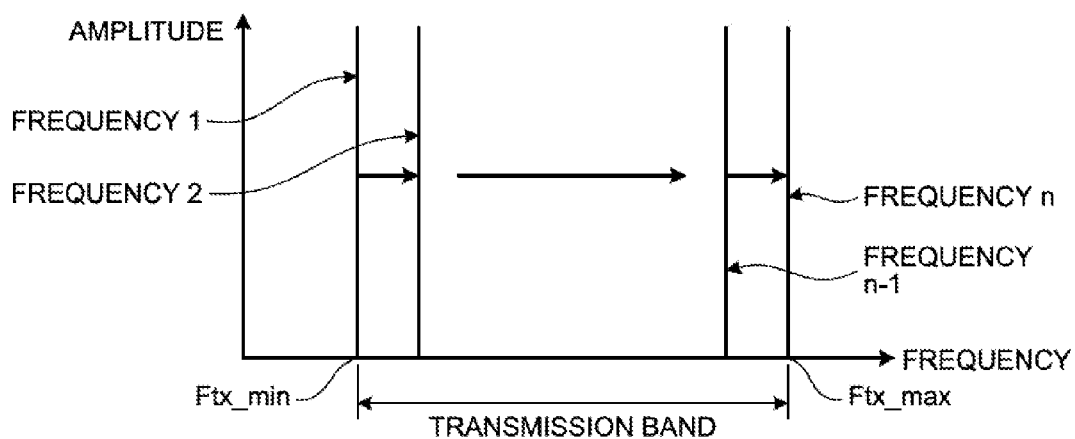
FIG. 15 is an explanatory diagram of the processing operation of the radio apparatus according to the second embodiment.

Subsequently, the transmission processing unit 11 generates the fifth local signal according to control of the correction control unit 40 in the "FW-correction processing period". As illustrated in FIG. 15, the fifth local signal includes a plurality of CW signals respectively corresponding to a plurality of frequency points (frequency 1 to frequency n) in the transmission band. The frequency 1 corresponds to a minimum value Ftx_min of the frequency in the transmission band, and the frequency n corresponds to a maximum value Ftx_max of the frequency in the transmission band. The amplitudes of the CW signals are the same. The transmission processing unit 11 outputs the CW signals in the order of having a low frequency as the fifth local signal.

The correction control unit 40 sets the switch 32 to the second state and sets the switch 33 to the second state in cooperation with the switch control unit in the "FW-correction processing period". Accordingly, in the "FW-correction processing period", the fifth local signal is input to the correction control unit 40 via the "transmission path" and the "feedback path".

Figure 16:
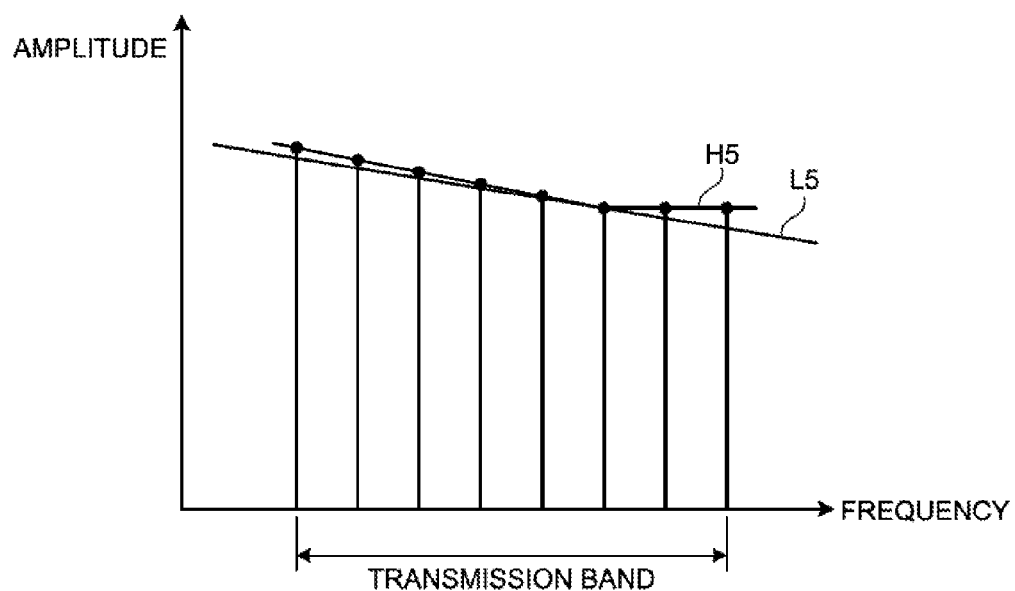
FIG. 16 is an explanatory diagram of the processing operation of the radio apparatus according to the second embodiment.
Figure 17:
FIG. 17 is an explanatory diagram of the processing operation of the radio apparatus according to the second embodiment.

The correction control unit 40 detects third amplitude deviation of the fifth local signal received via the "transmission path" and the "feedback path" in the "FW-correction processing period". That is, as illustrated in FIG. 16, a curve connecting the amplitude values of the respective CW signals is a third amplitude deviation H5 with respect to the frequency.

The correction control unit 40 adjusts the third correction coefficient of the correction processing unit 39 based on the detected "third amplitude deviation" of the fifth local signal.

For example, the correction control unit 40 determines whether the "third amplitude deviation" falls within a preset "target amplitude range". That is, the correction control unit 40 determines whether an amplitude value that does not fall within the "target amplitude range" is included in the amplitude values of the respective CW signals received via the "transmission path" and the "feedback path". If the "third amplitude deviation" does not fall within the "target amplitude range", the correction control unit 40 derives an approximate straight line L5, as illustrated in FIG. 16, with regard to the amplitude value of the fifth local signal corresponding to the respective frequencies in the "transmission band" in the third amplitude deviation H5. For example, a least squares method is used for deriving the approximate straight line L5. The correction control unit 40 derives a reverse approximate straight line L6 illustrated in FIG. 17 by reversing the sign of inclination of the derived approximate straight line L5. The correction control unit 40 calculates a "third adjustment value" of the third correction coefficient of the correction processing unit 39 based on the derived reverse approximate straight line L6.

Figure 18:
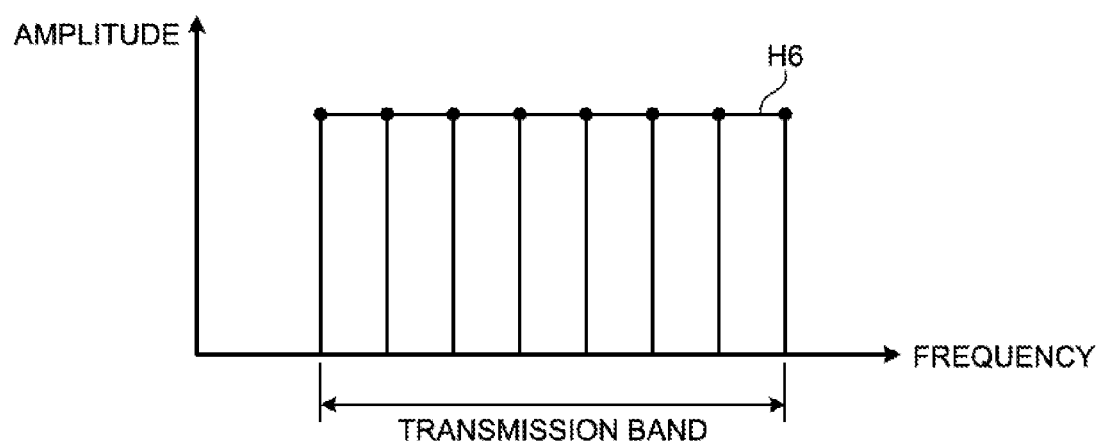
FIG. 18 is an explanatory diagram of the processing operation of the radio apparatus according to the second embodiment.

Because the "FW-correction processing period" described above is repeated at every cycle of the reception time interval of the TDD method, as illustrated in FIG. 18, a third amplitude deviation H6 with respect to the frequency approaches a straight line parallel to the frequency axis, and falls within the "target amplitude range". If a difference between the respective amplitude values of the third amplitude deviation detected previously and the respective amplitude values of the third amplitude deviation detected this time exceeds a predetermined threshold, the correction control unit 40 detects that a gain of the PA 16 in the "transmission path" has changed, and can output an alarm indicating this matter.

As described above, according to the second embodiment, in the radio apparatus 30, the correction processing unit 35 corrects amplitude deviation in the reception band being the frequency range of a reception signal transferred via the "reception path" by using the first correction coefficient. The local oscillation unit 19 generates the third local signal that sweeps the reception band with predetermined frequency spacing according to control of the correction control unit 36 and outputs the third local signal to the "reception path". The correction control unit 36 causes the local oscillation unit 19 to generate the third local signal, and receives the third local signal via the "reception path". The correction control unit 36 detects the first amplitude deviation of the third local signal received via the "reception path" and adjusts the first correction coefficient of the correction processing unit 35 based on the detected first amplitude deviation.

According to the configuration of the radio apparatus 30, amplitude deviation in a reception band can be planarized. Therefore, even if the characteristics of a "reception path" change according to passage of time and temperature, the quality of a reception signal can be improved.

Furthermore, in the radio apparatus 30, the correction processing unit 37 corrects amplitude deviation in the feedback band being the frequency range of a feedback signal by using the second correction coefficient. The local oscillation unit 19 also generates the fourth local signal that sweeps the feedback band with predetermined frequency spacing, and outputs the fourth local signal to the "feedback path" including the frequency conversion unit 20 and the ADC 21. The correction control unit 38 causes the local oscillation unit 19 to generate the fourth local signal and receives the fourth local signal via the "feedback path". The correction control unit 38 detects the second amplitude deviation of the fourth local signal received via the "feedback path" and adjusts the second correction coefficient of the correction processing unit 37 based on the detected second amplitude deviation.

According to the configuration of the radio apparatus 30, amplitude deviation in a feedback band can be planarized. Therefore, even if the characteristics of a "feedback path" change according to passage of time and temperature, the quality of a feedback signal can be improved.

Furthermore, in the radio apparatus 30, the correction processing unit 39 corrects amplitude deviation in a transmission band being the frequency range of a transmission signal by using the third correction coefficient. The transmission processing unit 11 generates the fifth local signal that sweeps the transmission band with predetermined frequency spacing according to control of the correction control unit 40 as a test signal, and outputs the fifth local signal to the "transmission path" including the PA 16. The correction control unit 40 causes the transmission processing unit 11 to generate the fifth local signal and receives the fifth local signal via the "transmission path" and the "feedback path". The correction control unit 40 detects the third amplitude deviation of the fifth local signal received via the "transmission path" and the "feedback path" and adjusts the third correction coefficient of the correction processing unit 39 based on the detected third amplitude deviation.

According to the configuration of the radio apparatus 30, amplitude deviation in a transmission band can be planarized. Therefore, even if the characteristics of a "transmission path" change according to passage of time and temperature, the quality of a transmission signal can be improved.

[c] Third Embodiment

In a third embodiment, a radio apparatus compensates the nonlinear distortion of the PA 16 by using the ADC included in the "transmission path" and the ADC included in the "reception path" in parallel.

Figure 19:
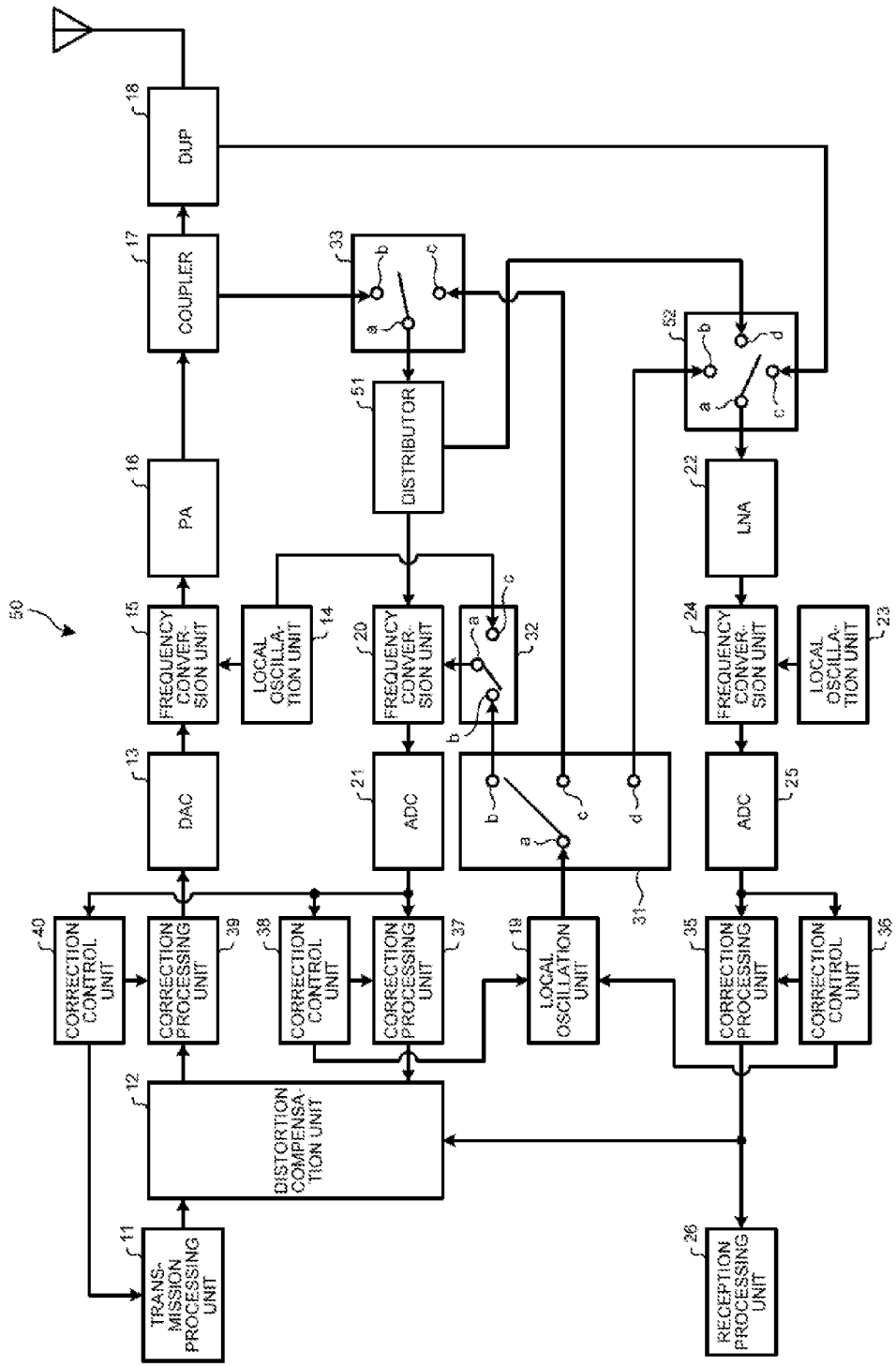
FIG. 19 is a block diagram illustrating an example of a radio apparatus according to a third embodiment.

FIG. 19 is a block diagram illustrating an example of the radio apparatus according to the third embodiment. In FIG. 19, a radio apparatus 50 includes a distributor 51. The radio apparatus 50 also includes a switch 52 instead of the switch 34 illustrated in FIG. 5.

The distributor 51 is connected to the output terminal a of the switch 33 and the input of the frequency conversion unit 20. When the switch 33 is set to the "second state" in the "distortion-compensation processing period", the distributor 51 distributes a feedback signal input from the switch 33 to the frequency conversion unit 20 and the switch 52.

The switch 52 includes an output terminal a and input terminals b, c, and d. The output terminal a of the switch 52 is connected with the output of the LNA 22. The input terminal b of the switch 52 is connected with the output terminal d of the switch 31. The input terminal c of the switch 52 is connected with the output of the DUP 18. The input terminal d of the switch 52 is connected with an output of the distributor 51. In the "reception-correction processing period", the output terminal a of the switch 52 is connected with the input terminal b of the switch 52. In the "distortion-compensation processing period", the output terminal a of the switch 52 is connected with the input terminal d of the switch 52. Accordingly, in the "distortion-compensation processing period", a feedback signal being an output of the distributor 51 is input to the frequency conversion unit 24. In the periods other than the "reception-correction processing period" and the "distortion-compensation processing period", the output terminal a of the switch 52 is connected with the input terminal c of the switch 52. The connection state of the switch 52 is switched by the switch control unit described above. A state where the output terminal a of the switch 52 is connected with the input terminal b of the switch 52 is referred to as "first state" of the switch 52. The "first state" of the switch 52 corresponds to the "first state" of the switch 34 in the second embodiment described above. A state where the output terminal a of the switch 52 is connected with the input terminal c of the switch 52 is referred to as "second state" of the switch 52. The "second state" of the switch 52 corresponds to the "second state" of the switch 34 in the second embodiment described above. Further, a state where the output terminal a of the switch 52 is connected with the input terminal d of the switch 52 is referred to as "third state" of the switch 52.

In the radio apparatus 50 illustrated in FIG. 19, the local oscillation unit 19 generates a second local signal corresponding to the frequencies "Ftx±BW" and "Ftx±2BW" away from the central frequency Ftx by the integral multiple of the bandwidth BW of the transmission signal in the "distortion-compensation processing period". The local oscillation unit 19 outputs the generated second local signal to the frequency conversion unit 20 via the switches 31 and 32.

The frequency conversion unit 20 frequency-converts the feedback signal by using the second local signal input from the local oscillation unit 19 in the "distortion-compensation processing period", and outputs the frequency-converted second signal to the ADC 21. That is, the frequency conversion unit 20 frequency-converts the feedback signal by using the second local signal in the "distortion-compensation processing period", and outputs the frequency-converted second signal in which the IM3 component and the IM5 component fall within the "AD conversion band" to the ADC 21.

In the "distortion-compensation processing period", the ADC 21 performs analog-to-digital conversion on the frequency-converted second signal in the "AD conversion band", and outputs the analog-to-digital converted second signal to the distortion compensation unit 12 via the correction processing unit 37. That is, in the "distortion-compensation processing period", the ADC 21 performs analog-to-digital conversion on the IM3 component and the IM5 component in the frequency-converted second signal respectively in the "AD conversion band". The ADC 21 then outputs the analog-to-digital converted IM3 component and IM5 component to the distortion compensation unit 12 as a feedback signal.

The local oscillation unit 23 generates a local signal corresponding to the central frequency Frx of the reception signal in a "reception period" and outputs the generated local signal to the frequency conversion unit 24. The "reception period" is a reception time interval of a TDD method, for example, when the TDD method is applied to the radio apparatus 50. In the "distortion-compensation processing period", the local oscillation unit 23 generates a first local signal having the central frequency Ftx of the transmission signal and outputs the generated first local signal to the frequency conversion unit 24. The "distortion-compensation processing period" can be the transmission time interval of a TDD method, when the TDD method is applied to the radio apparatus 50.

The frequency conversion unit 24 frequency-converts the reception signal by using the local signal input from the local oscillation unit 23 in the "reception period", and outputs the frequency-converted reception signal to the ADC 25. The frequency conversion unit 24 also frequency-converts the feedback signal input from the switch 52 and the LNA 22 by using the first local signal input from the local oscillation unit 23 in the "distortion-compensation processing period, and outputs the frequency-converted feedback signal to the ADC 25. That is, the frequency conversion unit 24 frequency-converts the feedback signal by using the first local signal in the "distortion-compensation processing period", and outputs the frequency-converted first signal in which the main signal component corresponding to the transmission signal falls within the "AD conversion band" to the ADC 25. The "AD conversion band" here is a frequency band in which analog-to-digital conversion is performed by the ADC 25, and has a bandwidth corresponding to the transmission signal. It is assumed that the predetermined bandwidth is narrower than the bandwidth of the "distortion compensation band", and in the third embodiment, is the same as the bandwidth BW of the transmission signal.

In the "reception period", the ADC 25 performs analog-to-digital conversion on the frequency-converted reception signal and outputs the analog-to-digital converted reception signal to the reception processing unit 26 via the correction processing unit 35. Further, in the "distortion-compensation processing period", the ADC 25 performs analog-to-digital conversion on the frequency-converted first signal in the "AD conversion band" and outputs the analog-to-digital converted first signal to the distortion compensation unit 12 via the correction processing unit 35. That is, in the "distortion-compensation processing period", the ADC 25 performs analog-to-digital conversion on the main signal component of the frequency-converted first signal in the "AD conversion band" and outputs the analog-to-digital converted main signal component to the distortion compensation unit 12 as a feedback signal. Accordingly, in the distortion compensation unit 12, the distortion compensation coefficient is updated so that an error between the sum of the main signal component, the IM3 component, and the IM5 component and the transmission signal decreases. In this manner, the main signal component, the IM3 component, and the IM5 component are individually output to the distortion compensation unit 12, and the distortion compensation coefficient is updated in the distortion compensation unit 12, thereby enabling to realize distortion compensation using an inexpensive ADC having a narrow "AD conversion band". In the "distortion-compensation processing period", because the ADC 21 included in the "transmission path" and the ADC 25 included in the "reception path" are used in parallel, compensation of nonlinear distortion of the PA 16 is performed at a high speed.

As described above, according to the third embodiment, in the radio apparatus 50, the distributor 51 distributes a feedback signal to the frequency conversion unit 20 and the switch 52 in the "distortion-compensation processing period". The frequency conversion unit 20 frequency-converts the feedback signal by using the second local signal input from the local oscillation unit 19 in the "distortion-compensation processing period", and outputs the frequency-converted second signal to the ADC 21. In the "distortion-compensation processing period", the ADC 21 performs analog-to-digital conversion on the frequency-converted second signal in the "AD conversion band", and outputs the analog-to-digital converted second signal to the distortion compensation unit 12. Meanwhile, in the "distortion-compensation processing period", the frequency conversion unit 24 frequency-converts the feedback signal input from the switch 52 and the LNA 22 by using the first local signal input from the local oscillation unit 23, and outputs the frequency-converted feedback signal to the ADC 25. In the "distortion-compensation processing period", the ADC 25 performs analog-to-digital conversion on the frequency-converted first signal in the "AD conversion band", and outputs the analog-to-digital converted first signal to the distortion compensation unit 12 via the correction processing unit 35.

According to the configuration of the radio apparatus 50, in the "distortion-compensation processing period", because the ADC 21 included in the "transmission path" and the ADC 25 included in the "reception path" are used in parallel, compensation of nonlinear distortion of the PA 16 is performed at a high speed.

[d] Fourth Embodiment

In a fourth embodiment, a radio apparatus determines abnormality in the "reception path".

Figure 20:
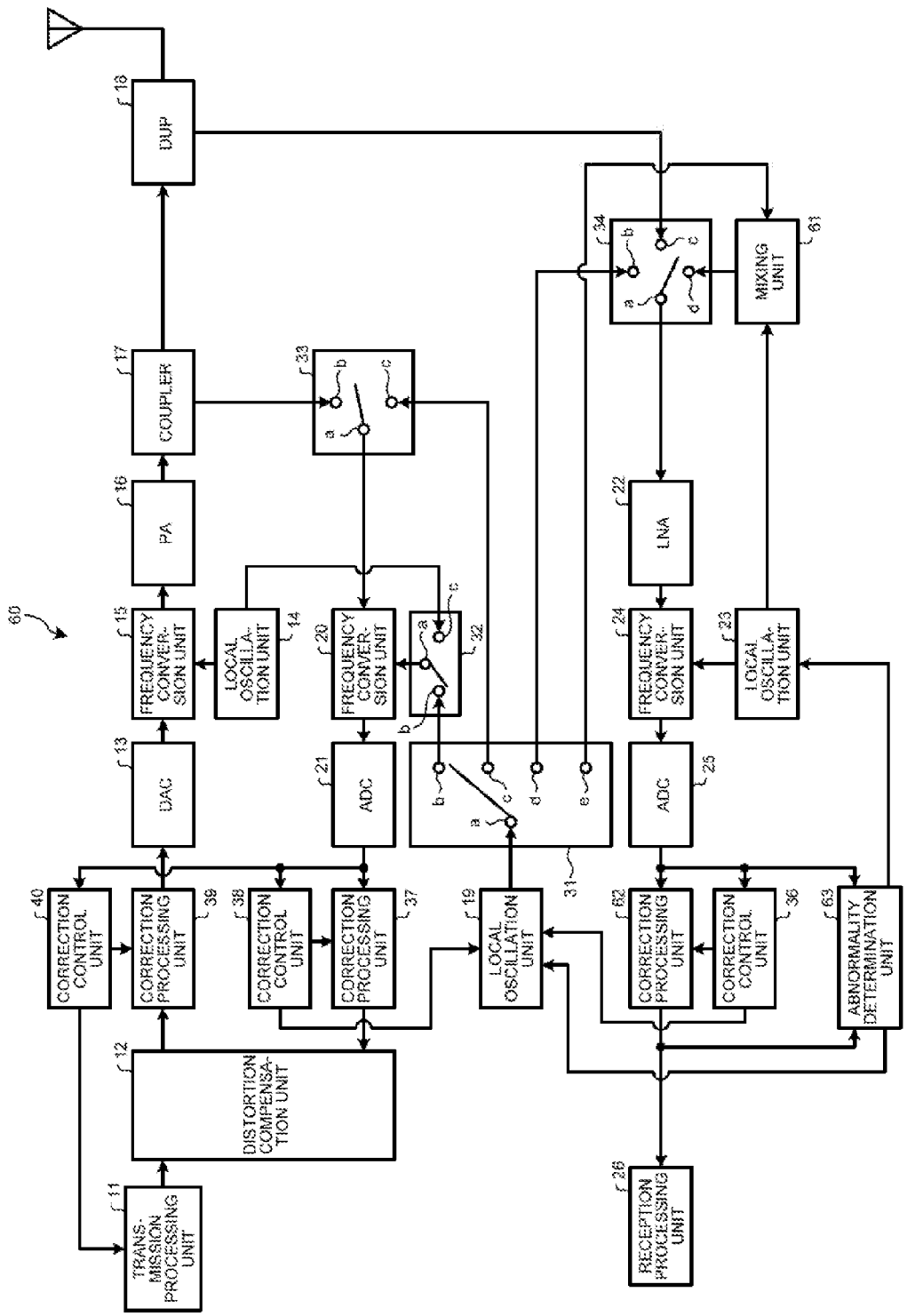
FIG. 20 is a block diagram illustrating an example of a radio apparatus according to a fourth embodiment.

FIG. 20 is a block diagram illustrating an example of the radio apparatus according to the fourth embodiment. In a radio apparatus 60 illustrated in FIG. 20, the local oscillation unit 19 generates a second monitoring signal corresponding to a frequency Frx+X deviated from the central frequency Frx of the reception signal by a predetermined "offset value" in an "abnormality determination period" according to control of an abnormality determination unit 63 described later. The "abnormality determination period" is a period for determining abnormality in the "reception path", and for example, is a transmission time interval of a TDD method. Abnormality in the "reception path" includes a status in which characteristics of a component included in the "reception path" (for example, the LNA 22) change according to passage of time and temperature. The local oscillation unit 19 outputs the generated second monitoring signal to a mixing unit 61 described later via the switch 31.

The switch 31 has basically the same configuration and functions as those of the switch 31 illustrated in FIG. 5. The switch 31 has an output terminal e. The output terminal e of the switch 31 is connected with an input of the mixing unit 61. In the "abnormality determination period", the input terminal a of the switch 31 is connected with the output terminal e of the switch 31. The connection state of the switch 31 is switched according to control of the switch control unit described above. A state where the input terminal a of the switch 31 is connected with the output terminal e of the switch 31 is referred to as "fourth state" of the switch 31.

The switch 34 has basically the same configuration and functions as those of the switch 34 illustrated in FIG. 5. The switch 34 has an input terminal d. The input terminal d of the switch 34 is connected with an output of the mixing unit 61. In the "abnormality determination period", the output terminal a of the switch 34 is connected with the input terminal d of the switch 34. The connection state of the switch 34 is switched according to control of the switch control unit described above. A state where the output terminal a of the switch 34 is connected with the input terminal d of the switch 34 is referred to as "third state" of the switch 34.

In the "abnormality determination period", the local oscillation unit 23 generates a first monitoring signal having the central frequency Frx of the reception signal according to control of the abnormality determination unit 63, and outputs the generated first monitoring signal to the mixing unit 61.

In FIG. 20, the radio apparatus 60 includes the mixing unit 61 and the abnormality determination unit 63. The radio apparatus 60 also includes a correction processing unit 62 instead of the correction processing unit 35 illustrated in FIG. 5.

In the "abnormality determination period", the mixing unit 61 mixes the first monitoring signal input from the local oscillation unit 23 with the second monitoring signal input from the local oscillation unit 19 via the switch 31. The mixing unit 61 outputs a mixed signal including the first monitoring signal and the second monitoring signal to the "reception path" via the switch 34. By outputting the mixed signal to the "reception path", a distortion component is generated near the central frequency Frx of the reception signal and the frequency Frx+X.

The correction processing unit 62 has basically the same configuration and functions as those of the correction processing unit 35 illustrated in FIG. 5. The correction processing unit 62 also functions as a band limiting unit in the "abnormality determination period". That is, the correction processing unit 62 limits the frequency band with respect to the mixed signal received via the "reception path" in the "abnormality determination period", using a frequency range corresponding to the "offset value" as a passband, and outputs the frequency band-limited mixed signal to the reception processing unit 26. In the frequency band-limited mixed signal, a distortion component generated near the central frequency Frx of the reception signal and the frequency Frx+X is attenuated.

The abnormality determination unit 63 determines abnormality in the "reception path" by using the mixed signal received via the "reception path" and the frequency band-limited mixed signal. Specifically, in the "abnormality determination period", the abnormality determination unit 63 sets the switch 31 to the fourth state and sets the switch 34 to the third state in cooperation with the switch control unit. Further, the abnormality determination unit 63 causes the local oscillation unit 23 and the local oscillation unit 19 to generate the first monitoring signal and the second monitoring signal, respectively. Accordingly, in the "abnormality determination period", the mixed signal is output from the mixing unit 61 and the mixed signal is input to the correction processing unit 62 and the abnormality determination unit 63 via the "reception path". The abnormality determination unit 63 then calculates a power value of the mixed signal received via the "reception path" and a power value of the mixed signal frequency band-limited by the correction processing unit 62 in the "abnormality determination period", and calculates a "difference" between the calculated two power values. The value of the "difference" corresponds to the magnitude of the distortion component generated near the central frequency Frx of the reception signal and the frequency Frx+X. When the calculated "difference" exceeds a predetermined threshold, the abnormality determination unit 63 determines that the distortion component generated near the central frequency Frx of the reception signal and the frequency Frx+X has increased and thus determines that abnormality has occurred in the "reception path". When having determined that abnormality has occurred in the "reception path", the abnormality determination unit 63 can output an alarm indicating this matter.

As described above, according to the fourth embodiment, in the radio apparatus 60, the mixing unit 61 mixes a first monitoring signal having the central frequency of a reception signal with a second monitoring signal having a frequency deviated from the central frequency of the reception signal by a predetermined "offset value". The mixing unit 61 then outputs the mixed signal including the first monitoring signal and the second monitoring signal to the "reception path". The correction processing unit 62 limits the frequency band with respect to the mixed signal received via the "reception path", using the frequency range corresponding to the "offset value" as a passband, and outputs the frequency band-limited mixed signal. The correction processing unit 62 determines abnormality in the "reception path" by using the mixed signal received via the "reception path" and the frequency band-limited mixed signal.

According to the configuration of the radio apparatus 60, when the characteristics of the "reception path" change according to passage of time and temperature, abnormality in the "reception path" can be determined accurately.

[e] Other Embodiments (1) In the fourth embodiment, an example in which abnormality in the "reception path" is determined by using a mixed signal including a first monitoring signal and a second monitoring signal has been described. However, the technique disclosed here is not limited thereto. For example, the radio apparatus can calculate a signal-noise (SN) ratio by using the third local signal and determine abnormality in the "reception path" based on the calculated SN ratio. In this case, in the radio apparatus, the correction control unit 36 detects an amplitude value of the third local signal (that is, an amplitude value of respective CW signals) received via the "reception path" as a signal level, and stops the third local signal from the local oscillation unit 19 to detect a noise level. The abnormality determination unit then calculates the SN ratio based on the signal level and the noise level detected by the correction control unit 36, and compares the calculated SN ratio with a predetermined threshold. If the SN ratio is equal to or lower than the predetermined threshold, the abnormality determination unit determines that abnormality has occurred in the "reception path". When having determined that abnormality has occurred in the "reception path", the abnormality determination unit can output an alarm indicating this matter.

(2) Respective constituent elements of respective units illustrated in the drawings according to the first to fourth embodiments do not necessarily have to be physically configured in the way as illustrated in these drawings. That is, the specific mode of distribution and integration of the respective units is not limited to the illustrated ones and all or a part of these units can be functionally or physically distributed or integrated in an arbitrary unit, according to various kinds of load and the status of use.

Furthermore, all or an arbitrary part of various processing functions performed by respective devices can be realized by a central processing unit (CPU) (or a microcomputer such as a micro processing unit (MPU) and an micro controller unit (MCU)), or by a program analyzed and executed in the CPU (or a microcomputer such as an MPU and an MCU), or realized as hardware by a wired logic.

The radio apparatus according to the first to fourth embodiments can be realized by, for example, a hardware configuration described below.

Figure 21:
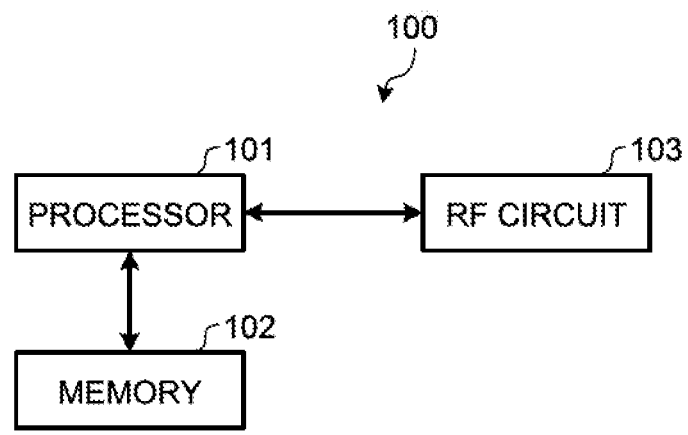
FIG. 21 is a diagram illustrating an example of a hardware configuration of a radio apparatus.

FIG. 21 is a diagram illustrating an example of a hardware configuration of a radio apparatus. As illustrated in FIG. 21, a radio apparatus 100 includes a processor 101, a memory 102, and a radio frequency (RF) circuit 103. As an example of the processor 101, a CPU, a digital signal processor (DSP), a field programmable gate array (FPGA), and the like can be mentioned. Further, as an example of the memory 102, a random access memory (RAM) such as a synchronous dynamic random access memory (SDRAM), a read only memory (ROM), a flash memory, and the like can be mentioned.

Various processing functions performed in the radio apparatus according to the first to fourth embodiments can be realized by executing programs stored in various memories such as a non-volatile memory medium by a processor provided in an amplifying device.

That is, programs corresponding to respective processes performed by the transmission processing unit 11, the distortion compensation unit 12, the correction control unit 36, the correction control unit 38, the correction control unit 40, and the abnormality determination unit 63 can be stored in the memory 102, and the respective programs can be executed by the processor 101. Further, the DAC 13, the local oscillation unit 14, the frequency conversion unit 15, the PA 16, the coupler 17, the DUP 18, the local oscillation unit 19, the frequency conversion unit 20, the ADC 21, the LNA 22, the local oscillation unit 23, the frequency conversion unit 24, and the ADC 25 are realized by the RF circuit 103. The switches 31, 32, 33, and 34, the correction processing unit 35, the correction processing unit 37, and the correction processing unit 39 are also realized by the RF circuit 103. Further, the distributor 51, the switch 52, the correction processing unit 62, and the mixing unit 61 are realized by the RF circuit 103.

According to one aspect of the radio apparatus disclosed in the present application, nonlinear distortion of an amplifier can be compensated by using an inexpensive ADC.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A radio apparatus comprising:
   an amplifier that amplifies power of a transmission signal;
   a first mixer that mixes a feedback signal from the amplifier with a local signal of a predetermined frequency;
   an analog-to-digital converter that performs analog-to-digital conversion on an output signal of the first mixer;
   a distortion compensator that compensates nonlinear distortion of the amplifier based on a digital signal obtained by performing the analog-to-digital conversion; and
   an oscillator that changes a frequency of the local signal to be mixed with the feedback signal in the first mixer in a time division manner, with frequency spacing corresponding to a sampling rate of the analog-to-digital converter,
   the oscillator generates a first local signal having a central frequency of the transmission signal and a second local signal having a frequency away from the central frequency by an integral multiple of a bandwidth of the transmission signal as the local signal in a time division manner,
   the first mixer frequency-converts, using the first local signal, the feedback signal to output a first signal in which a main signal component corresponding to the transmission signal falls within a predetermined frequency band, and frequency-converts, using the second local signal, the feedback signal to output a second signal in which a distortion component generated in the frequency falls within the frequency band,
   the analog-to-digital converter performs analog-to-digital conversion respectively on the main signal component of the first signal and the distortion component of the second signal in the frequency band, and
   the distortion compensator updates a distortion compensation coefficient to be used for compensation of nonlinear distortion of the amplifier based on a sum of the analog-to-digital converted main signal component and the distortion component and the transmission signal.

2. A radio apparatus comprising:
   an amplifier that amplifies power of a transmission signal;
   a first mixer that mixes a feedback signal from the amplifier with a local signal of a predetermined frequency;
   an analog-to-digital converter that performs analog-to-digital conversion on an output signal of the first mixer;
   a distortion compensator that compensates nonlinear distortion of the amplifier based on a digital signal obtained by performing the analog-to-digital conversion;
   an oscillator that changes a frequency of the local signal to be mixed with the feedback signal in the first mixer in a time division manner, with frequency spacing corresponding to a sampling rate of the analog-to-digital converter;
   a correction processor that corrects, using a correction coefficient, amplitude deviation in a reception band, which is a frequency range of a reception signal transferred via a reception path; and
   a correction controller that adjusts the correction coefficient,
   the oscillator generates a third local signal that sweeps the reception band with predetermined frequency spacing, and outputs the third local signal to the reception path, and
   the correction controller causes the oscillator to generate the third local signal, receives the third local signal via the reception path, detects amplitude deviation of the third local signal received via the reception path, and adjusts the correction coefficient based on the detected amplitude deviation.

3. The radio apparatus according to claim 2, further comprising:
   a second mixer that mixes a first monitoring signal having a central frequency of the reception signal with a second monitoring signal having a frequency deviated from the central frequency of the reception signal by a predetermined offset value, and outputs a mixed signal including the first monitoring signal and the second monitoring signal to the reception path;
   a band limiter that limits a frequency band with respect to the mixed signal received via the reception path, using a frequency range corresponding to the offset value as a passband, and outputs the frequency band-limited mixed signal; and
   an abnormality determinator that determines, using the mixed signal received via the reception path and the frequency band-limited mixed signal, abnormality in the reception path.

4. A radio apparatus comprising:
   an amplifier that amplifies power of a transmission signal;
   a first mixer that mixes a feedback signal from the amplifier with a local signal of a predetermined frequency;
   an analog-to-digital converter that performs analog-to-digital conversion on an output signal of the first mixer;
   a distortion compensator that compensates nonlinear distortion of the amplifier based on a digital signal obtained by performing the analog-to-digital conversion;
   an oscillator that changes a frequency of the local signal to be mixed with the feedback signal in the first mixer in a time division manner, with frequency spacing corresponding to a sampling rate of the analog-to-digital converter;
   a first correction processor that corrects, using a first correction coefficient, amplitude deviation in a feedback band, which is a frequency range of the feedback signal; and
   a first correction controller that adjusts the correction coefficient,
   the oscillator generates a third local signal that sweeps the feedback band with predetermined frequency spacing, and outputs the third local signal to a feedback path including the frequency converter and the analog-to-digital converter, and the first correction controller causes the oscillator to generate the third local signal, receives the third local signal via the feedback path, detects amplitude deviation of the third local signal received via the feedback path, and adjusts the correction coefficient based on the detected amplitude deviation.

5. The radio apparatus according to claim 4, further comprising:

a transmission processor that generates and outputs the transmission signal or a test signal;

a second correction processor that corrects, using a second correction coefficient, amplitude deviation in a transmission band, which is a frequency range of the transmission signal; and a second correction controller that adjusts the second correction coefficient, wherein the transmission processor generates a forth local signal that sweeps the transmission band with predetermined frequency spacing as the test signal and outputs the fifth local signal to a transmission path including the amplifier, and the second correction controller causes the transmission processing unit to generate the forth local signal, receives the forth local signal via the transmission path and the feedback path, detects second amplitude deviation of the forth local signal received via the transmission path and the feedback path, and adjusts the second correction coefficient based on the detected third amplitude deviation.

* * * * *